US012757766B2

(12) United States Patent
Kuwahara et al.

(10) Patent No.: US 12,757,766 B2
(45) Date of Patent: Oct. 6, 2026

(54) SEMICONDUCTOR DEVICE

(71) Applicant: ROHM CO., LTD., Kyoto (JP)

(72) Inventors: Eiji Kuwahara, Kyoto (JP); Toru Higuchi, Kyoto (JP); Daisuke Sakizono, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 478 days.

(21) Appl. No.: 18/458,804

(22) Filed: Aug. 30, 2023

(65) Prior Publication Data

US 2023/0411273 A1 Dec. 21, 2023

Related U.S. Application Data

(63) Continuation of application No. PCT/JP2022/003111, filed on Jan. 27, 2022.

(30) Foreign Application Priority Data

Mar. 17, 2021 (JP) ................................ 2021-043633

(51) Int. Cl.
*H10W 70/65* (2026.01)
*H10W 70/69* (2026.01)
(Continued)

(52) U.S. Cl.
CPC ........... *H10W 70/65* (2026.01); *H10W 70/69* (2026.01); *H10W 72/884* (2026.01); *H10W 90/736* (2026.01); *H10W 90/756* (2026.01)

(58) Field of Classification Search
CPC ............... H01L 24/48; H01L 23/49894; H01L 23/49838
See application file for complete search history.

(56) References Cited

U.S. PATENT DOCUMENTS 6,114,229 A * 9/2000 Hause ............... H01L 21/28035 438/585
7,067,412 B2 * 6/2006 Fukumoto ............ H01L 23/528 438/599

(Continued)

FOREIGN PATENT DOCUMENTS

JP H05-315323 A 11/1993
JP 2004-134594 A 4/2004

(Continued)

OTHER PUBLICATIONS

German Office Action issued for corresponding German patent application No. 11 2022 001 552.7 dated Sep. 17, 2025.

(Continued)

*Primary Examiner* — Evren Seven
(74) *Attorney, Agent, or Firm* — Rabin & Berdo, P.C.

(57) ABSTRACT

A semiconductor device includes a semiconductor substrate, a first electroconductive member that is formed on the semiconductor substrate and that has a first linear portion extending along a principal surface of the semiconductor substrate, and an organic insulation layer that is formed on the semiconductor substrate and that covers the first electroconductive member, and the first linear portion includes a first side edge portion formed by a curve that is alternately bent to one side and to an opposite side of a direction intersecting a longitudinal direction of the first linear portion in a plan view.

12 Claims, 8 Drawing Sheets

(51) Int. Cl.
*H10W 72/00* (2026.01)
*H10W 90/00* (2026.01)

(56) References Cited

U.S. PATENT DOCUMENTS

| | | | | |
|---|---|---|---|---|
| 9,596,767 | B2 * | 3/2017 | Dote | H05K 3/282 |
| 2004/0072415 | A1 | 4/2004 | Fukumoto | |
| 2015/0373850 | A1 | 12/2015 | Dote | |
| 2019/0326329 | A1 | 10/2019 | Fan et al. | |

FOREIGN PATENT DOCUMENTS

| | | | |
|---|---|---|---|
| JP | 2016-009745 | A | 1/2016 |
| JP | 2020-155483 | A | 9/2020 |
| JP | 2020-167330 | A | 10/2020 |
| WO | 2015030891 | A2 | 3/2015 |

OTHER PUBLICATIONS

Japanese Office Action issued for corresponding JP Application No. 2023-506825 dated Oct. 9, 2025.
International Search Report for PCT/JP2022/003111, mailed on Apr. 5, 2022.
Written Opinion of the International Searching Authority for PCT/JP2022/003111, mailed on Apr. 5, 2022.
Office Action issued for corresponding Chinese patent application No. 202280022050.2, and its English translation, dated Apr. 30, 2026.

* cited by examiner

SEMICONDUCTOR DEVICE

CROSS REFERENCE TO RELATED APPLICATIONS

The present application is a continuation application of PCT Application No. PCT/JP2022/003111, filed on Jan. 27, 2022, which corresponds to Japanese Patent Application No. 2021-43633 filed on Mar. 17, 2021 with the Japan Patent Office, and the entire disclosure of this application is incorporated herein by reference.

TECHNICAL FIELD

The present disclosure relates to a semiconductor device.

BACKGROUND ART

For example, Japanese Patent Application Publication No. 2020-167330 discloses a semiconductor package including an electroconductive member, a semiconductor device, a bonding layer, and a sealing resin. The semiconductor device is a flip-chip type LSI. The semiconductor device has an element body, a plurality of electrodes, and a front surface protection film. The front surface protection film is made of polyimide, and covers a base portion of the plurality of electrodes.

DESCRIPTION OF EMBODIMENTS

Figure 1:
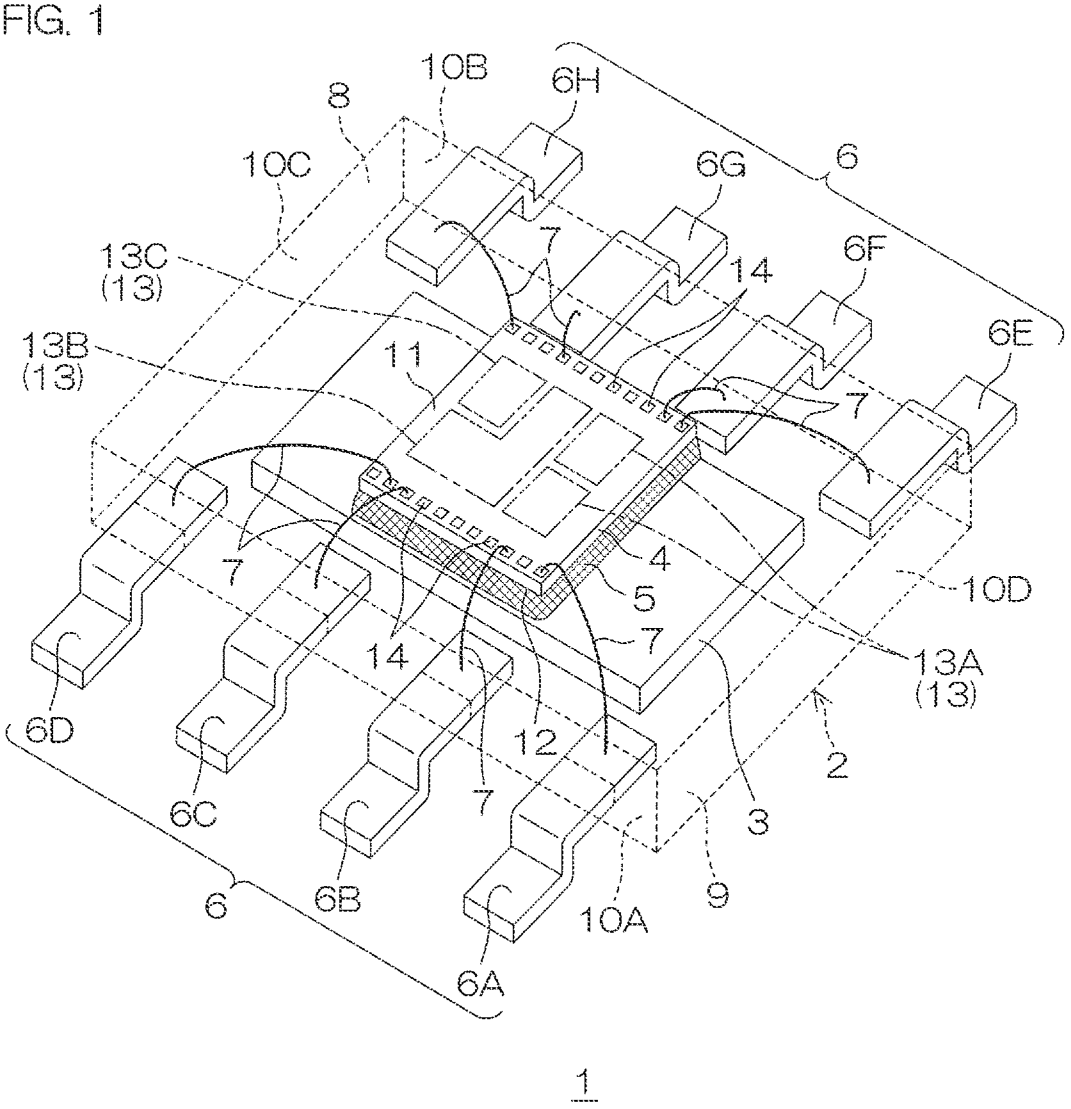
FIG. 1 is a schematic perspective view of a semiconductor device according to a preferred embodiment of the present disclosure.

First, a preferred embodiment of the present disclosure will be described in an itemized form.

A semiconductor device (1) according to a preferred embodiment of the present disclosure includes a semiconductor substrate (4, 15), a first electroconductive member (25) that is formed on the semiconductor substrate (4, 15) and that has a first linear portion (36) extending along a principal surface (11) of the semiconductor substrate (4, 15), and an organic insulation layer (55) that is formed on the semiconductor substrate (4, 15) and that covers the first electroconductive member (25), in which the first linear portion (36) includes a first side edge portion (46) formed by a curve (47) that is alternately bent to one side and to an opposite side in a direction intersecting a longitudinal direction of the first linear portion (36) in a plan view.

There is a case in which a high stress will be generated in the first side portion of the first linear portion because of a difference in the thermal expansion coefficient between the first electroconductive member and the organic insulation layer when ambient temperature changes, for example, if the first side edge portion of the first linear portion is a straight line. If an external force is applied to the organic insulation layer by this stress when expansion and shrinkage are caused by a change in temperature, a distortion will occur in the organic insulation layer, and the mechanical characteristics of the organic insulation layer might decrease. Therefore, if the semiconductor device according to the preferred embodiment is employed, it is possible to disperse the stress generated in the first side portion of the first linear portion because the first side edge portion is formed by a curve. This makes it possible to reduce the stress of the first side portion of the first linear portion of the first electroconductive member as a whole. As a result, it is possible to restrain a distortion that occurs in the organic insulation layer when expansion and shrinkage are caused by a change in temperature.

In the semiconductor device (1) according to a preferred embodiment of the present disclosure, the first linear portion (36) may include a base portion (40) to which a joining member is connectable and a first side portion (41) including a convex portion (44, 48) that protrudes from the base portion (40) in the direction intersecting a longitudinal direction of the first linear portion (36) and a concave portion (45, 49) that is hollowed with respect to the convex portion (44, 48), and the first side edge portion (46) may be formed by a curve (47) that continuously connects the convex portion (44, 48) and the concave portion (45, 49) along the longitudinal direction of the first linear portion (36) in a plan view.

With this configuration, the stress generated in the first side portion including the convex portion and the concave portion is dispersed, and therefore it is possible to restrain a decrease in the mechanical characteristics of the organic insulation layer even if a stress is further applied to the first linear portion when a joining member is connected to the base portion of the first linear portion. Additionally, a stress dispersion structure is formed by selectively forming the convex portion and the concave portion at the first side portion of the first linear portion, not by the fact that the first electroconductive member meanders as a whole so as to assume the shape of the letter S. Therefore, there is no need to widen an installation space for the first electroconductive member according to the preferred embodiment, and therefore it is possible to prevent the semiconductor device from being enlarged.

In the semiconductor device (1) according to a preferred embodiment of the present disclosure, the base portion (40) may be formed in a belt shape having a first width ($W_2$), and the first width ($W_2$) of the base portion (40) may be ten or more times as long as an amount ($P_1$) of protrusion of the convex portion (44, 48) from the base portion (40).

With this configuration, it is possible to achieve a stress dispersion effect in the first electroconductive member, for example, by forming a convex portion having an amount of protrusion corresponding to about 1/10 of the width of an already-existing first electroconductive member (for example, wiring line or electrode). Conversely speaking, it is possible to comparatively widely maintain the first width of the base portion even if the stress dispersion structure is formed by both the convex portion and the concave portion.

As a result, it is possible to leave many choices (e.g., shape, thickness, etc., of the joining member) for the joining member that is joinable to the base portion.

In the semiconductor device (1) according to a preferred embodiment of the present disclosure, the first electroconductive member (25) may include a forward end portion (39) including a part of the first linear portion (36) and a second linear portion (37) connected to the first linear portion (36) through a corner portion (38), and the first side edge portion (46) may be selectively formed at the first linear portion (36) that is one of the first linear portion (36) and the second linear portion (37).

With this configuration, the first side edge portion having a curved shape is formed at the first linear portion including the forward end portion in which a stress is easily caused by a change in ambient temperature, and therefore it is possible to effectively disperse the stress in the first electroconductive member.

In the semiconductor device (1) according to a preferred embodiment of the present disclosure, the forward end portion (39) of the first electroconductive member (25) may have a first side surface (52) formed by a first circular arc (51) having a first curvature radius ($R_1$) in a plan view, and the first side edge portion (46) of the first electroconductive member (25) may have a second side surface (54) formed by a second circular arc (53) having a second curvature radius ($R_2$) smaller than the first curvature radius ($R_1$) in a plan view.

In the semiconductor device (1) according to a preferred embodiment of the present disclosure, the first electroconductive member (25) may include a first base layer (26) and a first covering layer (27) stacked on the first base layer (26) so as to protrude sidewardly from an end surface (29) of the first base layer (26) in a cross-sectional view, and the first side edge portion (46) may be selectively formed at the first covering layer (27).

With this configuration, the first side edge portion having a curved shape is selectively formed at the first covering layer, and is not required to be formed at the first base layer. Therefore, it is possible to reduce the number of steps of a process of forming the first side edge portion.

In the semiconductor device (1) according to a preferred embodiment of the present disclosure, the organic insulation layer (55) may have a pad opening (56) that exposes the base portion (40) of the first linear portion (36) as a pad.

With this configuration, it is possible to connect a joining member, such as a bonding wire, to the base portion of the first linear portion through the pad opening.

The semiconductor device (1) according to a preferred embodiment of the present disclosure may further include a second electroconductive member (59) connected to the base portion (40) of the first linear portion (36) in the organic insulation layer (55).

With this configuration, the stress dispersion structure mentioned above prevents mechanical characteristics of the organic insulation layer around the second electroconductive member from being lowered. Therefore, it is possible to improve connection reliability between the first electroconductive member (first linear portion) and the second electroconductive member.

In the semiconductor device (1) according to a preferred embodiment of the present disclosure, the second electroconductive member (59) may have a third linear portion (72) that extends along the principal surface (11) of the semiconductor substrate (4, 15), and the third linear portion (72) may include a second side edge portion (79) formed by a curve (80) that is alternately bent to one side and to an opposite side in a direction intersecting a longitudinal direction of the third linear portion (72) in a plan view.

With this configuration, it is possible to disperse the stress generated in the second side portion of the third linear portion because the second side edge portion is formed by a curve. This makes it possible to reduce the stress of the second side portion of the third linear portion of the second electroconductive member as a whole. As a result, it is possible to restrain a distortion that occurs in the organic insulation layer when expansion and shrinkage are caused by a change in temperature.

In the semiconductor device (1) according to a preferred embodiment of the present disclosure, the second electroconductive member (59) may include a second base layer (60) and a second covering layer (61) stacked on the second base layer (60) so as to protrude sidewardly from an end surface (63) of the second base layer (60) in a cross-sectional view, and the second side edge portion (79) may be selectively formed at the second covering layer (61).

With this configuration, the second side edge portion having a curved shape is selectively formed at the second covering layer, and is not required to be formed at the second base layer. Therefore, it is possible to reduce the number of steps of a process of forming the second side edge portion.

The semiconductor device (1) according to a preferred embodiment of the present disclosure may include an insulation-layer layered structure (17) that is formed between the first electroconductive member (25) and the semiconductor substrate (4, 15) and that includes at least a first inorganic insulation layer (18, 57) and a second inorganic insulation layer (19, 58) stacked on the first inorganic insulation layer (18, 57).

The semiconductor device (1) according to a preferred embodiment of the present disclosure may include an integrated circuit element (16) that is formed at the semiconductor substrate (4, 15) and that is electrically connected to the first electroconductive member (25).

With this configuration, it is possible to reduce the stress of the first side portion of the first linear portion of the first electroconductive member as described above, and therefore it is possible to provide a semiconductor device including an integrated circuit in which the insulation reliability of an organic insulation layer is high.

In the description given above, each numeric character or the like in parentheses represents a reference sign of a corresponding component mentioned in the detailed description given below. However, each component mentioned above is not intended to be limited by the reference sign as an equivalent of each component mentioned below.

Next, a preferred embodiment of the present disclosure will be described in detail with reference to the accompanying drawings. In the following detailed description, a plurality of components each of which has a name to which an ordinal number has been assigned exist, and yet this ordinal number and an ordinal number of a component recited in the claims do not necessarily coincide with each other.

FIG. 1 is a schematic perspective view of a semiconductor device 1 according to a preferred embodiment of the present disclosure.

The semiconductor device 1 is a so-called SOP (Small Outline Package) in the preferred embodiment. The semiconductor device 1 includes a sealing resin 2, a die pad 3, a semiconductor chip 4, a conductive joining material a plurality of lead terminals 6, and a plurality of lead wires 7.

The sealing resin 2 may include, for example, an epoxy resin. The sealing resin 2 may be referred to as a resin package. The sealing resin 2 is formed in a rectangular parallelepiped shape. The sealing resin 2 includes a first principal surface 8 on one side, a second principal surface 9 on the other side, and four side surfaces 10A, 10B, 10C, and 10D that connect the first principal surface 8 and the second principal surface 12 together. In detail, the four side surfaces 10A to 10D include a first side surface 10A, a second side surface 10B, a third side surface 10C, and a fourth side surface 10D. The first side surface 10A and the second side surface 10B face each other. The third side surface 10C and the fourth side surface 10D face each other.

The die pad 3 is disposed in the sealing resin 2. The die pad 3 may be exposed from the second principal surface 9. The die pad 3 includes a metal plate formed in a rectangular parallelepiped shape. The die pad 3 may include at least one among Fe, Au, Ag, Cu, and Al. The die pad 3 may have an outer surface on which at least one among an Ni plated layer, an Au plated layer, an Ag plated layer, and a Cu plated layer is formed.

A plurality of lead terminals 6 include a first lead terminal 6A, a second lead terminal 6B, a third lead terminal 6C, a fourth lead terminal 6D, a fifth lead terminal 6E, a sixth lead terminal 6F, a seventh lead terminal 6G, and an eighth lead terminal 6H. The number of lead terminals 6 is adjusted in accordance with the function of the semiconductor chip 4, and is not limited to that of FIG. 1.

The four lead terminals 6A to 6D are disposed on the first-side-surface-10A side of the sealing resin 2. The four lead terminals 6A to 6D are disposed at a distance from the die pad 3. The four lead terminals 6A to 6D are arranged at a distance from each other in a direction in which the first side surface 10A extends. The four lead terminals 6A to 6D cross the first side surface 10A from the inside of the sealing resin 2, and is pulled outwardly from the sealing resin 2.

The four lead terminals 6E to 6H are disposed on the second-side-surface-10B side of the sealing resin 2. The four lead terminals 6E to 6H are disposed at a distance from die pad 3. The four lead terminals 6E to 6H are arranged at a distance from each other in a direction in which the second side surface 10B extends. The four lead terminals 6E to 6H cross the second side surface 10B from the inside of the sealing resin 2, and is pulled outwardly from the sealing resin 2.

The plurality of lead terminals 6 may include at least one among Fe, Au, Ag, Cu, and Al. The plurality of lead terminals 6 may have an outer surface on which at least one among an Ni plated layer, an Au plated layer, an Ag plated layer, and a Cu plated layer is formed.

The semiconductor chip 4 includes, for example, an LSI (Large Scale Integration) chip. The semiconductor chip 4 is disposed on the die pad 3. The semiconductor chip 4 has a first principal surface 11 on one side and a second principal surface 12 on the other side. A plurality of element regions 13 in which elements forming a circuit of the LSI are made are formed in the first principal surface 11 of the semiconductor chip 4. The plurality of element regions 13 may include, for example, a diode region 13A, a transistor region 13B, a resistor element region 13C, and the like. A plurality of pads 14 are formed on the first principal surface 11 of the semiconductor chip 4. The plurality of pads 14 are arranged on the four-lead-terminals-6A-6D side and the four-lead-terminals-6E-6H side in the first principal surface 11 of the semiconductor chip 4. The plurality of pads 14 are electrically connected to a functional element 16 (circuit element forming the LSI) described later.

The conductive joining material 5 is interposed between the semiconductor chip 4 and the die pad 3, and joins the semiconductor chip 4 to the die pad 3. The conductive joining material 5 includes a solder or an electroconductive paste. The solder may be a lead-free solder. The solder may include at least one among SnAgCu, SnZnBi, SnCu, SnCuNi, and SnSbNi. The metal paste may include at least one among Au, Ag, and Cu. Preferably, the conductive joining material 5 is made of a silver paste. Particularly preferably, the silver paste includes a sintered silver paste. The sintered silver paste may include a paste in which Ag particles each of which has a nano size or a micro size have been dispersed into an organic solvent.

The plurality of lead wires 7 are adjusted in accordance with the function of the semiconductor chip 4, and are not limited to the number of lead wires shown in FIG. 1. The plurality of lead wires 7 electrically connect the plurality of lead terminals 6 and the plurality of pads 14 together. The plurality of lead wires 7 include an aluminum wire, which is an example of a bonding wire, in the preferred embodiment. The plurality of lead wires 7 may be gold wires or copper wires instead of the aluminum wires.

The package form of the semiconductor device 1 may be other than SOP. For example, the semiconductor device 1 may have a package form, such as TO (Transistor Outline), QFN (Quad For Non Lead Package), DFP (Dual Flat Package), DIP (Dual Inline Package), QFP (Quad Flat Package), SIP (Single Inline Package), or SOJ (Small Outline J-leaded Package), or may be various package forms similar to these forms.

Figure 2:
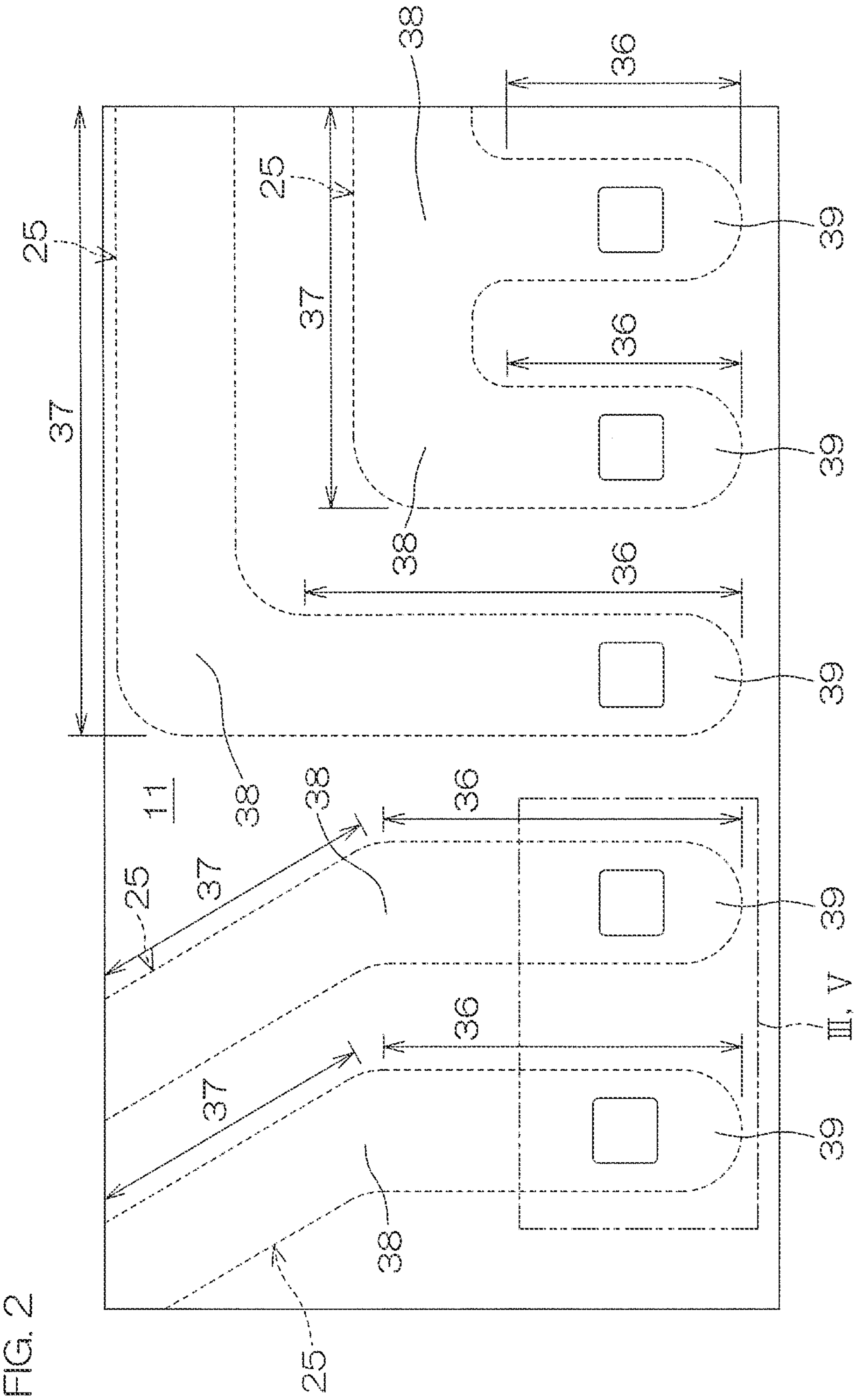
FIG. 2 is a plan enlarged view of a semiconductor chip of FIG. 1.
Figure 3:
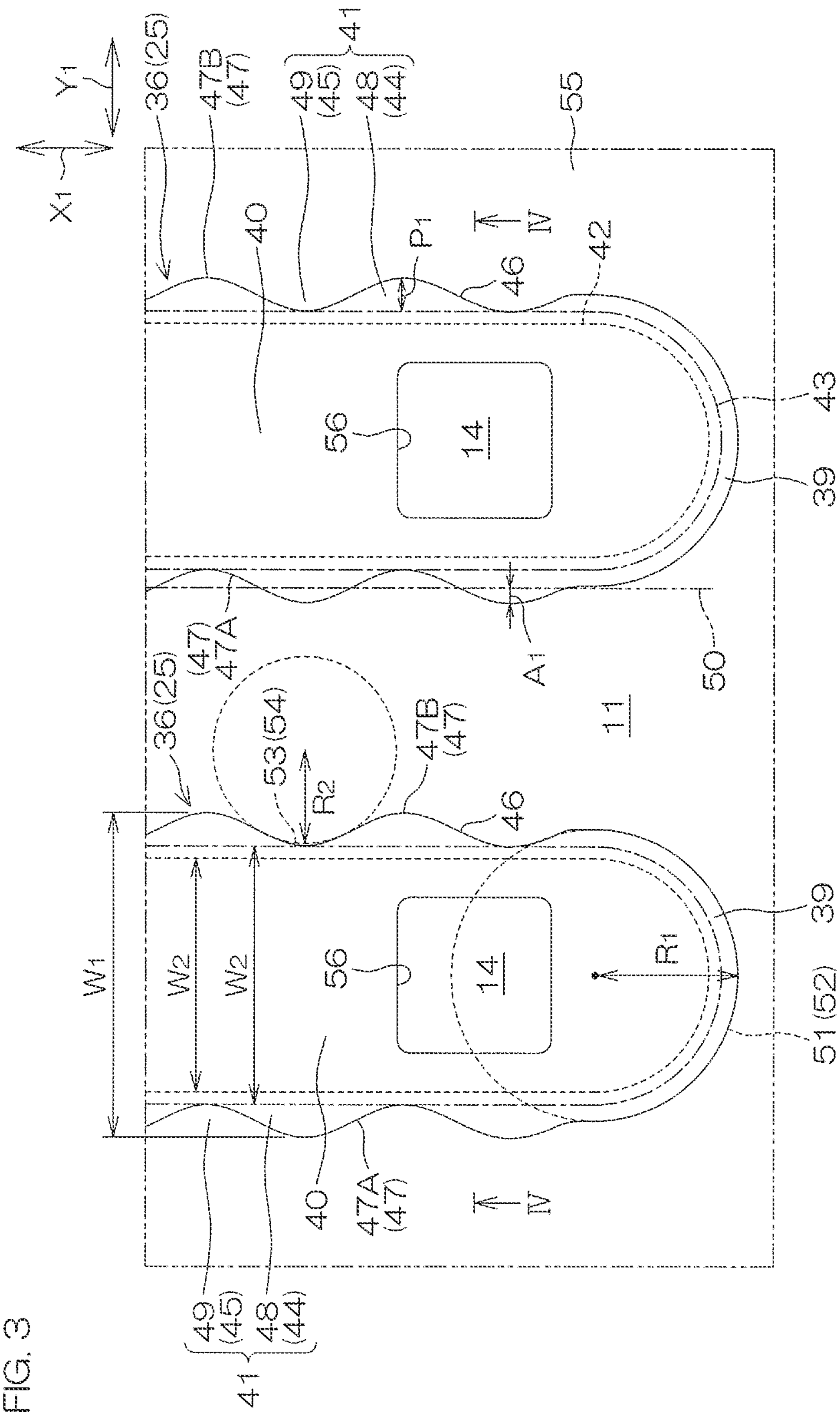
FIG. 3 is an enlarged view (first form) of a part surrounded by an alternate long and two short dashed line III of FIG. 2.
Figure 4:
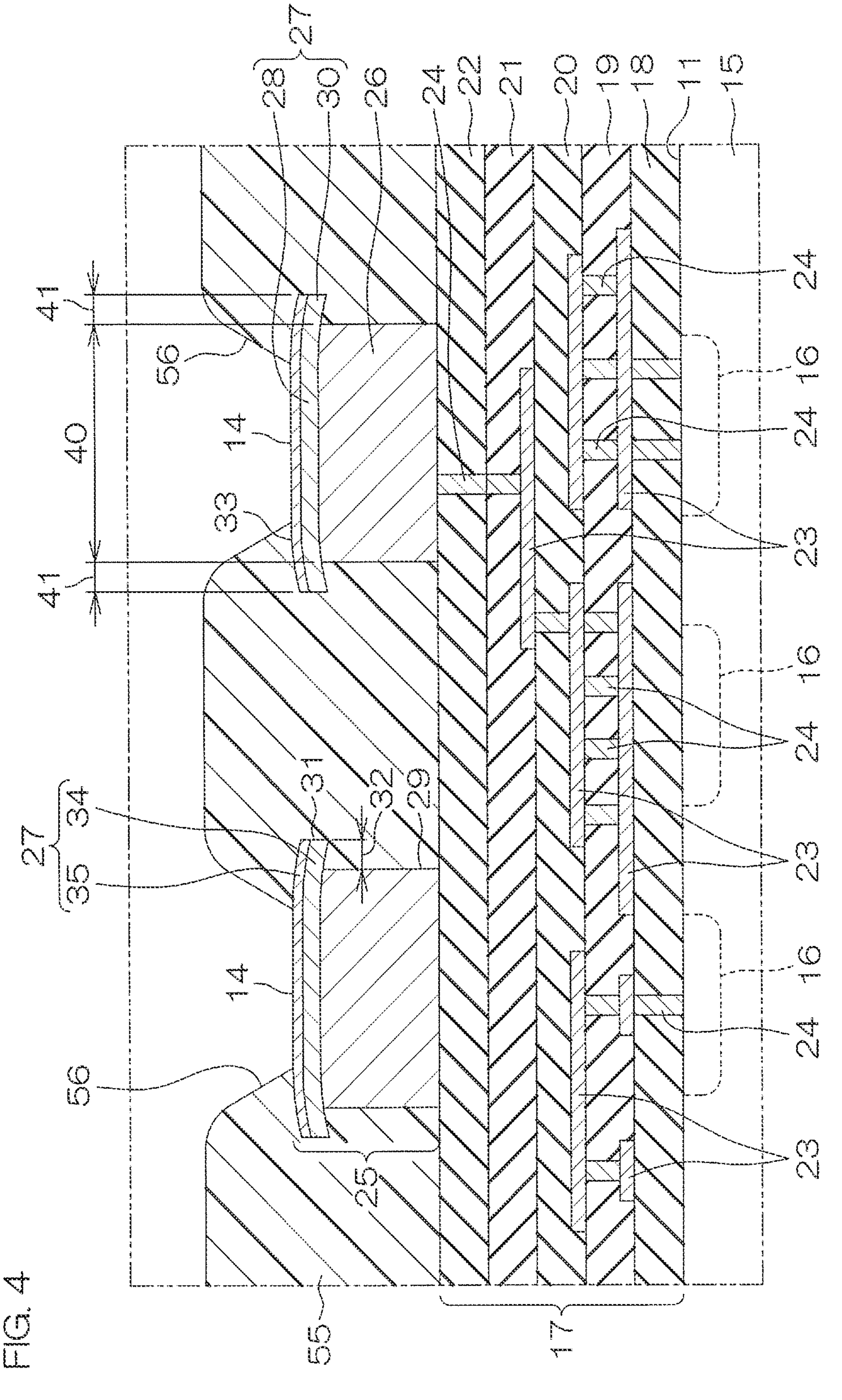
FIG. 4 is a cross-sectional view along line IV-IV shown in FIG. 3.

FIG. 2 is a plan enlarged view of the semiconductor chip 4 of FIG. 1, and shows the surroundings of the pad 14. FIG. 3 is an enlarged view (first form) of a part surrounded by an alternate long and two short dashed line III of FIG. 2. FIG. 4 is a cross-sectional view along line IV-IV shown in FIG. 3.

Next, the first form of the semiconductor chip 4 will be described with reference to FIG. 2 to FIG. 4.

First, a cross-sectional structure of the semiconductor chip 4 will be described. Referring to FIG. 4, the semiconductor chip 4 includes a semiconductor substrate 15. The semiconductor substrate 15 may be an epitaxial substrate that includes, for example, a base substrate including Si and an epitaxial layer that grows on the base substrate. Additionally, the semiconductor chip 4 is formed in a layer shape, and therefore may be referred to as a semiconductor layer.

The first principal surface 11 and the second principal surface 12 of the semiconductor chip 4 may be the first principal surface 11 and the second principal surface 12 of the semiconductor substrate 15. A plurality of functional elements 16 are formed at the first principal surface 11 of the semiconductor substrate 15. The plurality of functional elements 16 may include, for example, circuit elements, such as a diode, a transistor, and a resistive element, of which LSI is composed.

An insulation-layer layered structure 17 is formed at the first principal surface 11 of the semiconductor substrate 15. The insulation-layer layered structure 17 includes a layered structure of a plurality of inorganic insulation layers. In the preferred embodiment, the insulation-layer layered structure 17 includes a first insulation layer 18, a second insulation layer 19, a third insulation layer 20, a fourth insulation layer 21, and a fifth insulation layer 22 that are layered in this order from the first principal surface 11 of the semiconductor substrate 15. Each of the insulation layers 18 to 22 of the insulation-layer layered structure 17 includes inorganic insulation materials, such as silicon oxide ($SiO_2$) and silicon nitride (SiN).

A plurality of wiring lines 23 and a plurality of vias 24 by which the wiring lines 23 placed mutually up-down positions are connected together are formed at each of the insulation layers 18 to 22. The wiring line 23 is electrically connected to the functional element 16 through the via 24. Thereby, the insulation-layer layered structure 17 is formed as a multilayer wiring structure in which the wiring line 23 electrically connected to the functional element 16 is provided at the plurality of insulation layers 18 to 22. The plurality of wiring lines 23 may include known wiring materials such as Cu and Al. The plurality of vias 24 may include known via materials such as W.

A first electroconductive member 25 is formed on the insulation-layer layered structure 17. In the preferred embodiment, the first electroconductive member 25 is a wiring line of an uppermost layer forming the pad 14 of the semiconductor chip 4, and may be referred to as a first wiring layer. Additionally, the first electroconductive member 25 is formed by a plurality of conductive layers, and may be referred to as a first conductive layer.

The first electroconductive member 25 includes a first base layer 26 and a first covering layer 27 stacked on the first base layer 26 in a cross-sectional view of FIG. 4. The first base layer 26 includes, for example, Cu, and may include a Cu plated layer in the preferred embodiment. The first base layer 26 is connected to, for example, the via 24. Thereby, the first electroconductive member 25 is electrically connected to the functional element 16 through the via 24 and the wiring line 23.

The first covering layer 27 covers the first base layer 26. The first covering layer 27 integrally includes a first covering portion 28 that comes into contact with an upper surface of the first base layer 26 and that covers the first base layer 26 and a first projection portion 30 that protrudes sidewardly from an end surface 29 of the first base layer 26. Thereby, a first level difference 32 corresponding to the amount of protrusion of the first projection portion 30 is formed between the end surface 29 of the first base layer 26 and an end surface 31 of the first covering layer 27. The first projection portion 30 may droop toward a lower side (i.e., side close to the first principal surface 11 of the semiconductor substrate 15) with respect to the first covering portion 28. Therefore, in an upper surface 33 of the first covering layer 27, parts on both sides of the upper surface 33 may be inclined downwardly with respect to a part of the upper surface 33 on the first base layer 26. The first covering layer 27 may be formed thinner than the first base layer 26. For example, the first base layer 26 may have a thickness of not less than 2 μm and not more than 3 μm, and the first covering layer 27 may have a thickness of not less than 1 μm and not more than 2 μm.

In the preferred embodiment, the first covering layer 27 includes a plurality of covering layers. The first covering layer 27 may include, for example, a first layer 34 contiguous to the first base layer 26 and a second layer 35 stacked on the first layer 34. The first layer 34 includes, for example, Ni, and may include an Ni plated layer in the preferred embodiment. The second layer 35 includes, for example, Pd, and may include a Pd plated layer in the preferred embodiment. The first covering layer 27 may further include an Au plated layer at its outermost surface (not shown). The first layer 34 and the second layer 35 are stacked at both the first covering portion 28 and the first projection portion 30. Thereby, a boundary between the first layer 34 and the second layer 35 may be exposed to the end surface 31 of the first covering layer 27.

Next, a planar structure of the first electroconductive member 25 will be described. Referring to FIG. 2, the first electroconductive member 25 extends widely through a region on the first principal surface 11 of the semiconductor substrate 15. In the preferred embodiment, the first electroconductive member 25 includes a first linear portion 36 and a second linear portion 37. The first linear portion 36 and the second linear portion 37 are each formed in a belt shape in a plan view, and are integrally connected together through a corner portion 38. The first linear portion 36 and the second linear portion 37 are each shown comparatively widely with respect to its length in FIG. 2, and therefore are each defined as having a belt shape. On the other hand, the first linear portion 36 and the second linear portion 37 may be each defined as having a linear shape or the like if the first linear portion 36 and the second linear portion 37 are very small in width with respect to its length.

The first linear portion 36 includes a forward end portion 39 that is an end portion of the first electroconductive member 25. The other end (not shown) on the opposite side of the forward end portion 39 of the first electroconductive member 25 may be connected to the via 24 mentioned above. The first linear portion 36 and the second linear portion 37 may intersect each other at mutually obtuse angles in the corner portion 38 in the same way as the two first electroconductive members 25 on the left side of FIG. 2. Additionally, the first linear portion 36 and the second linear portion 37 may intersect each other mutually-rectangularly in the corner portion 38 in the same way as the two first electroconductive members 25 on the right side of FIG. 2. In other words, the angle of the corner portion 38 may be an obtuse angle, or may be a right angle, or may be, of course, an acute angle.

A more detailed shape of the first linear portion 36 will be described with reference to FIG. 3. In FIG. 3, the longitudinal direction (extending direction) of the first linear portion 36 is represented as a first direction $X_1$, and the direction perpendicular to the first direction $X_1$ is represented as a second direction $Y_1$.

The first linear portion 36 includes a belt-shaped first base portion 40 extending in the first direction $X_1$ and a first side portion 41 integrally formed at both sides of the first base portion 40 in the second direction $Y_1$. The first base portion 40 is a region obtained by expediently setting a belt-shaped region that is extractable from the first linear portion 36 while maintaining substantially the same external shape as the first linear portion 36, for example, like an inner region of the first boundary portion 42 shown by a broken line in FIG. 3 or like an inner region of the first boundary portion 43 shown by an alternate long and short dashed line in FIG. 3.

The first base portion 40 is merely required to have a width that enables a joining member, such as the lead wire 7 mentioned above, to be connected. Additionally, the first base portion 40 may have a first width $W_2$ that is equal to or more than 80%, preferably, 90% of the width $W_1$ of the first linear portion 36. For example, the width $W_1$ of the first linear portion 36 may be not less than 12 μm and not more than 25 μm, and the first width $W_2$ of the first base portion 40 may be not less than 10 μm and not more than 20 μm. The width $W_1$ of the first linear portion 36 may be a distance between a top portion of a first convex portion 44 on one side and a top portion of the first convex portion 44 on the other side in the second direction $Y_1$.

In the preferred embodiment, the first side portion 41 is an outer region of the first boundary portion 42 or an outer region of the first boundary portion 43, and has an uneven structure formed to such an extent as not to affect the external shape of the first linear portion 36. In more detail, the first side portion 41 includes a first convex portion 44 that protrudes from the first base portion 40 in the second direction $Y_1$ and a first concave portion 45 that is hollowed with respect to the first convex portion 44. In the preferred embodiment, the first linear portion 36 has a first side edge portion 46 formed by a curve that alternately bends to one side (left side of plane of paper) and to an opposite side (right side of plane of paper) in the second direction $Y_1$. The first side edge portion 46 is an external shape line extending in the first direction $X_1$ of the first linear portion 36 in a plan view, and forms a side surface of the first linear portion 36. Therefore, the first side portion 41 of the first linear portion 36 is a region between the first base portion 40 and the first side edge portion 46, and the first convex portion 44 and the first concave portion 45 both of which form the first side portion 41 are formed by the first side edge portion 46 that has a curved shape and that is continuously connected along the first direction $X_1$.

The amount $P_1$ of protrusion of the first convex portion 44 of the first side portion 41 is merely required to be the amount of protrusion by which the external shape of the first linear portion 36 is not changed largely. For example, in comparison with the first width $W_2$ of the first base portion 40, the amount $P_1$ of protrusion may be equal to or less than 1/10 of the first width $W_2$ (i.e., the first width $W_2$ is ten or more times as much as the amount $P_1$ of protrusion). In other words, it is possible to maintain the first width $W_2$ of the first base portion 40 comparatively widely even if a stress dispersion structure is formed by the first convex portion 44 and the first concave portion 45. As a result, it is possible to leave many choices (e.g., shape, thickness, etc., of a wiring line or a wiring system) for a joining member that can be joined to the first base portion 40.

Additionally, the curved first side edge portion 46 may be a sine curve 47 extending along the first direction $X_1$ in the preferred embodiment. Thereby, the first side portion 41 includes a plurality of first curved convex portions 48 and a plurality of first curved concave portions 49 alternately formed along the first direction $X_1$. In this case, the first width $W_2$ of the first base portion 40 may be five or more times as long as an amplitude $A_1$ of the sine curve 47 from a first reference line 50 shown by an alternate long and two short dashed line in FIG. 3.

The first boundary portions 42 and 43 between the first side portion 41 and the first base portion 40 may be set by a line (alternate long and short dashed line of FIG. 3) that is formed, for example, by connecting the top portions of the plurality of first concave portions 45 together along the first direction $X_1$, or may be set by a line (broken line of FIG. 3) that is parallel to the above-described line formed by connecting the top portions and that is formed at a more slightly inward position than the top portions of the plurality of first concave portions 45.

The forward end portion 39 of the first electroconductive member 25 has a first side surface 52 formed by a first circular arc 51 having a first curvature radius $R_1$ in a plan view. In comparison with this first side surface 52, the first side edge portion 46 may have a second side surface 54 formed by a second circular arc 53 having a second curvature radius $R_2$ smaller than the first curvature radius $R_1$ in a plan view. If the first side edge portion 46 includes the sine curve 47, a curved surface of each of the first curved convex portion 48 and the first curved concave portion 49 may be formed by the second circular arc 53.

In the preferred embodiment, the first side edge portion 46 including the sine curve 47 is formed as a pair of first side edge portions along the first direction $X_1$. In other words, both side edges of the first linear portion 36 may be the first side edge portion 46 including the sine curve 47. The pair of sine curves 47 may include one sine curve 47A and the other sine curve 47B. When compared, the sine curve 47A and the other sine curve 47B may be different from each other in the formation position of the first curved convex portion 48 in the first direction $X_1$. For example, the first curved convex portion 48 of the sine curve 47A may deviate from the first curved convex portion 48 of the other sine curve 47B in the second direction $Y_1$.

In the preferred embodiment, the first curved convex portion 48 of the sine curve 47A faces the first curved concave portion 49 of the other sine curve 47B in the second direction $Y_1$. Additionally, the first curved convex portion 48 of the other sine curve 47B faces the first curved concave portion 49 of the sine curve 47A. Thereby, the first curved convex portion 48 (first curved concave portion 49) is formed alternately between the first side portion 41 including the sine curve 47A and the first side portion 41 including the other sine curve 47B in the first direction $X_1$.

As thus described, the first linear portion 36 has the first side portion 41 including both the first curved convex portion 48 and the first curved concave portion 49. On the other hand, there is a case in which the first curved convex portion 48 of the sine curve 47 and a curved portion of the first curved concave portion 49 will be seen as being pointed, for example, if the magnification is low when the first linear portion 36 is observed. In this case, the first side portion 41 may be defined as being formed in a zigzag shape in a plan view. The shape of the top portion of the first convex portion 44 that protrudes to the outside of the zigzag shape may correspond to the shape of the curved surface of the first curved convex portion 48.

Additionally, the first convex portion 44 and the first concave portion 45 mentioned above may be selectively formed at the first covering layer 27 that is one of the first base layer 26 and the first covering layer 27 both of which are constituents of the first electroconductive member 25. Of course, the first convex portion 44 and the first concave portion 45 may be formed at both the first base layer 26 and the first covering layer 27. Additionally, the first convex portion 44 and the first concave portion 45 may be selectively formed at the first linear portion 36 as shown in FIG. 3, or may be selectively formed at the second linear portion 37, or may be formed at both the first linear portion 36 and the second linear portion 37.

Referring to FIG. 4, a protective layer 55 is formed on the insulation-layer layered structure 17 so as to cover the first electroconductive member 25. The protective layer 55 includes an organic insulating resin. The organic insulating resin may include, for example, epoxy resin, phenolic resin, polyimide, etc. The protective layer 55 may be a resin layer having a thermal expansion coefficient higher than the first electroconductive member 25. For example, the first thermal expansion coefficient of Cu that forms a base layer of the first electroconductive member 25 may be not less than $16\times10^{-6}/°$ C. and not more than $18\times10^{-6}/°$ C., whereas the second thermal expansion coefficient of a resin (for example, epoxy resin) that forms the protective layer 55 may be not less than $45\times10^{-6}/°$ C. and not more than $65\times10^{-6}/°$ C. A pad opening 56 that exposes the first base portion 40 of the first linear portion 36 as the pad 14 is formed in the protective layer 55. The lead wire 7 mentioned above is connected to the first electroconductive member 25 through the pad 14.

Figure 5:
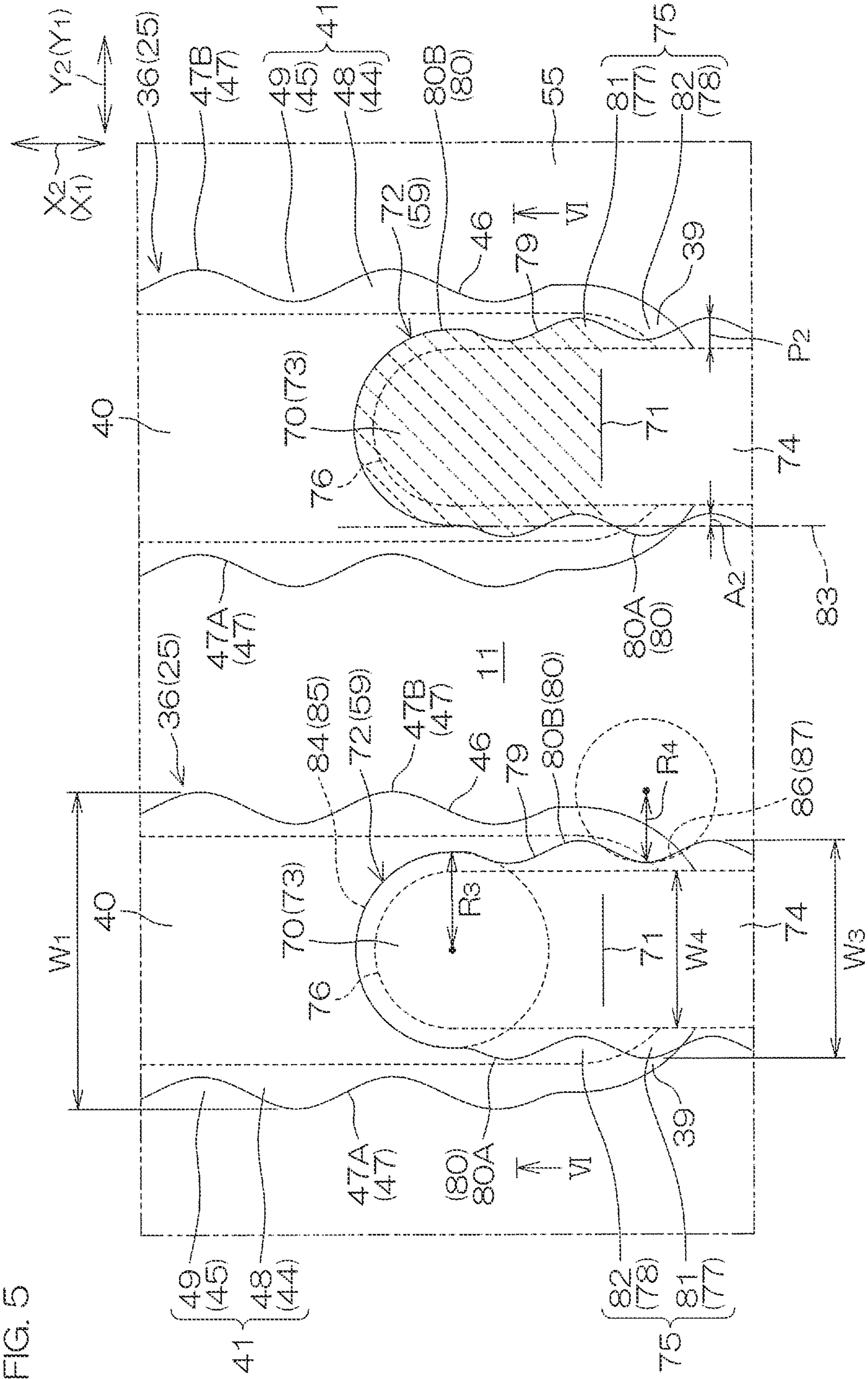
FIG. 5 is an enlarged view (second form) of a part surrounded by an alternate long and two short dashed line III of FIG. 2.
Figure 6:
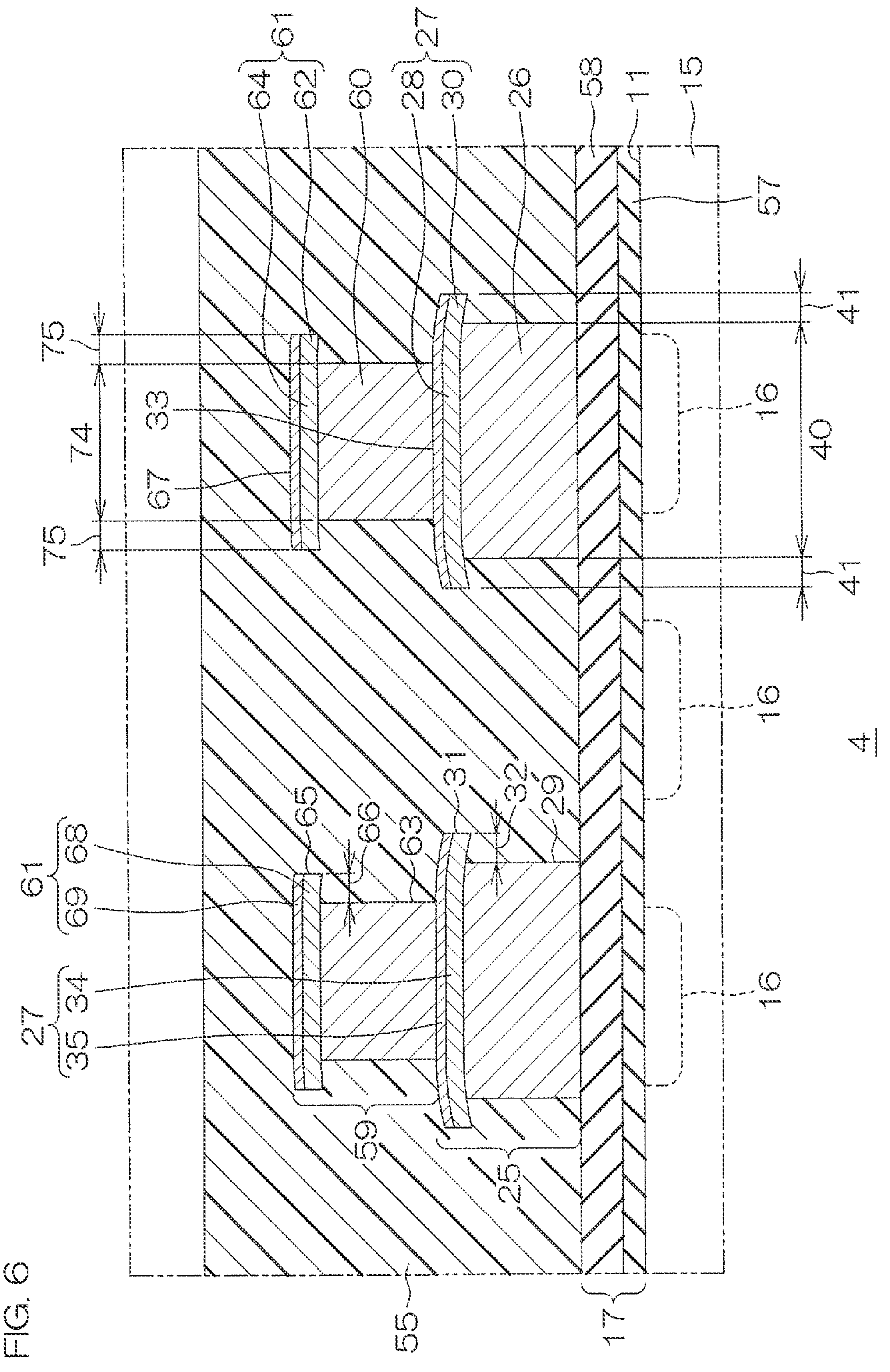
FIG. 6 is a cross-sectional view along line VI-VI shown in FIG. 3.

FIG. 5 is an enlarged view (second form) of a portion surrounded by an alternate long and two short dashed line III of FIG. 2. FIG. 6 is a cross-sectional view along line VI-VI shown in FIG. 3.

Next, the second form of the semiconductor chip 4 will be described. Hereinafter, the same reference sign is assigned to a structure described with reference to FIG. 2 to FIG. 4, and a description of this structure is omitted.

First, referring to FIG. 6, the wiring line 23 and the via 24 are not formed in a part, which is placed directly under the first electroconductive member 25, of the insulation-layer layered structure 17 in the thickness direction of the semiconductor substrate 15 in the second form. In other words, the first electroconductive member 25 may face the semiconductor substrate 15 not through the electroconductive member, such as the wiring line 23 or the via 24, but through only the insulation layer of the insulation-layer layered structure 17. The insulation-layer layered structure 17 in the second form includes a layered structure composed of a plurality of inorganic insulation layers, i.e., includes, for example, a first insulation layer 57 and a second insulation layer 58. Each of the insulation layers of the insulation-layer layered structure 17 includes inorganic insulation materials, such as silicon oxide ($SiO_2$) and silicon nitride (SiN).

The first insulation layer 57 and the second insulation layer 58 are insulation layers made of the same kind of insulation material, and yet may be insulation layers formed through mutually-different manufacturing methods. For example, the first insulation layer 57 may be a heat silicon oxide film, and the second insulation layer 58 may be a CVD (Chemical Vapor Deposition) silicon oxide film. In this case, the first insulation layer 57 may have a film quality that is denser than the second insulation layer 58.

The wiring line 23 and the via 24 are not formed directly under the first electroconductive member 25, and therefore the first electroconductive member 25 is not necessarily required to be electrically connected to the functional element 16 formed at the semiconductor substrate 15. Instead of this connection, the first electroconductive member 25 may be electrically connected to the functional element 16 mounted in another semiconductor device 1 differing from the semiconductor device 1, for example, through the lead wire 7 connected to the pad 14.

A second electroconductive member 59 is formed on the first electroconductive member 25. The second electroconductive member 59 is a wiring of a second layer stacked on the first electroconductive member 25, and may be referred to as a second wiring layer. Additionally, the second electroconductive member 59 is formed by a plurality of conductive layers, and may be referred to as a second conductive layer.

The second electroconductive member 59 includes a second base layer 60 and a second covering layer 61 stacked on the second base layer 60. The second base layer 60 includes, for example, Cu, and may include a Cu plated layer in the preferred embodiment. The second base layer 60 is connected to the first covering layer 27 of the first electroconductive member 25. Thereby, the second electroconductive member 59 is physically connected to the first electroconductive member 25.

The second covering layer 61 covers the second base layer 60. The second covering layer 61 integrally includes a second covering portion 62 that is contiguous to an upper surface of the second base layer 60 and that covers the second base layer 60 and a second projection portion 64 that protrudes sidewardly from an end surface 63 of the second base layer 60. Thereby, a second level difference 66 corresponding to the amount of protrusion of the second projection portion 64 is formed between the end surface 63 of the second base layer 60 and an end surface 65 of the second covering layer 61. The second projection portion 64 may face the first base layer 26 of the first electroconductive member 25 across a part of the protective layer 55.

The second projection portion 64 may droop to a lower side (i.e., side close to the first principal surface 11 of the semiconductor substrate 15) with respect to the second covering portion 62. Therefore, an upper surface 67 of the second covering layer 61 may have its both side parts inclined downwardly with respect to its part on the second base layer 60. The second covering layer 61 may be formed thinner than the second base layer 60. For example, the second base layer 60 may have a thickness of not less than 2 μm and not more than 3 μm, and the second covering layer 61 may have a thickness of not less than 1 μm and not more than 2 μm.

In the preferred embodiment, the second covering layer 61 includes a plurality of covering layers. The second covering layer 61 may include, for example, a first layer 68 contiguous to the second base layer 60 and a second layer 69 stacked on the first layer 68. The first layer 68 includes, for example, Ni, and may include an Ni plated layer in the preferred embodiment. The second layer 69 includes, for example, Pd, and may include a Pd plated layer in the preferred embodiment. The second covering layer 61 may further include an Au plated layer on its outermost surface (not shown). The first layer 68 and the second layer 69 are stacked at both the second covering portion 62 and the second projection portion 64. Thereby, a boundary between the first layer 68 and the second layer 69 may be exposed to the end surface 65 of the second covering layer 61.

Next, referring to FIG. 5, the second electroconductive member 59 is formed at a part, which is placed higher than the first electroconductive member 25, of the inside of the protective layer 55, and extends so as to coincide with the first electroconductive member 25 in a plan view. The second electroconductive member 59 has a connection portion 70 connected to the forward end portion 39 of the first electroconductive member 25. The connection portion 70 of the second electroconductive member 59 is shown by broken-line hatching in FIG. 5. For clarity, this hatching is given to only the single second electroconductive member 59.

The second electroconductive member 59 is bent upwardly in the connection portion 70, and extends in a direction away from the first electroconductive member 25 obliquely and upwardly. A straight line shown at an end portion of the connection portion 70 is a bent portion 71 of the second electroconductive member 59 in FIG. 5. Additionally, in the preferred embodiment, the first electroconductive member 25 extends toward one side in the first direction $X_1$, and the second electroconductive member 59 extends toward the other side in the first direction $X_1$ with the connection portion 70 between the first electroconductive member 25 and the second electroconductive member 59 as a boundary in a plan view. Thereby, the first electroconductive member 25 and the second electroconductive member 59 are arranged linearly along the first direction $X_1$.

In the preferred embodiment, the second electroconductive member 59 includes a third linear portion 72. The third linear portion 72 is formed in a belt shape in a plan view. The third linear portion 72 is shown comparatively widely with respect to its length in FIG. 5, and hence is defined as having a belt shape. On the other hand, the third linear portion 72 may be defined as, for example, being linear if its width is very small with respect to its length. The third linear portion 72 includes a forward end portion 73 that is an end portion of the second electroconductive member 59. The forward end portion 73 of the second electroconductive member 59 is a portion that is physically connected to the first electroconductive member 25.

Hereinafter, the longitudinal direction (extending direction) of the third linear portion 72 is defined as a third direction $X_2$, and the direction perpendicular to the third direction $X_2$ is defined as a fourth direction $Y_2$. In the preferred embodiment, the third direction $X_2$ and the fourth direction $Y_2$ coincide with the first direction $X_1$ and the second direction $Y_1$, respectively.

The third linear portion 72 includes a belt-shaped second base portion 74 extending in the third direction $X_2$ and a second side portion 75 integrally formed at both sides of the second base portion 74 in the fourth direction $Y_2$. The second base portion 74 is a region obtained by expediently setting a belt-shaped region that is extractable from the third linear portion 72 while maintaining substantially the same external shape as the third linear portion 72, for example, like an inner region of the second boundary portion 76 shown by a broken line in FIG. 5.

The second base portion 74 may have a second width $W_4$ that is equal to or more than 80%, preferably, 90% of the width $W_3$ of the third linear portion 72. For example, the width $W_3$ of the third linear portion 72 may be not less than 8 μm and not more than 20 μm, and the second width $W_4$ of the second base portion 74 may be not less than 7 μm and not more than 16 μm. The width $W_3$ of the third linear portion 72 may be a distance between a top portion of a second convex portion 77 on one side and a top portion of the second convex portion 77 on the other side in the fourth direction $Y_2$. Additionally, the width $W_3$ of the third linear portion 72 may be smaller than the width $W_1$ of the first linear portion 36 of the first electroconductive member 25. This makes it possible to provide a connection margin beside the second electroconductive member 59 when the second electroconductive member 59 is connected to the first electroconductive member 25.

In the preferred embodiment, the second side portion 75 is an outer region of the second boundary portion 76, and has an uneven structure formed to such an extent as not to affect the external shape of the third linear portion 72. In more detail, the second side portion 75 includes a second convex portion 77 that protrudes from the second base portion 74 in the fourth direction $Y_2$ and a second concave portion 78 that is hollowed with respect to the second convex portion 77. In the preferred embodiment, the third linear portion 72 has a second side edge portion 79 formed by a curve that alternately bends to one side (left side of plane of paper) and to an opposite side (right side of plane of paper) in the fourth direction $Y_2$. The second side edge portion 79 is an external shape line extending in the third direction $X_2$ of the third linear portion 72 in a plan view, and forms a side surface of the third linear portion 72. Therefore, the second side portion 75 of the third linear portion 72 is a region between the second base portion 74 and the second side edge portion 79, and the second convex portion 77 and the second concave portion 78 both of which form the second side portion 75 are formed by the second side edge portion 79 that has a curved shape and that is continuously connected along the third direction $X_2$.

The amount $P_2$ of protrusion of the second convex portion 77 of the second side portion 75 is merely required to be the amount of protrusion by which the external shape of the third linear portion 72 is not changed largely. For example, in comparison with the second width $W_4$ of the second base portion 74, the amount $P_2$ of protrusion may be equal to or less than 1/10 of the second width $W_4$ (i.e., the second width $W_4$ is ten or more times as much as the amount $P_2$ of protrusion). Additionally, the curved second side edge portion 79 may be a sine curve 80 extending along the third direction $X_2$ in the preferred embodiment. Thereby, the second side portion 75 includes a plurality of second curved convex portions 81 and a plurality of second curved concave portions 82 alternately formed along the third direction $X_2$. In this case, the second width $W_4$ of the second base portion 74 may be five or more times as long as an amplitude $A_2$ of the sine curve 80 from a second reference line 83 shown by an alternate long and two short dashed line in FIG. 5.

The forward end portion 73 of the second electroconductive member 59 has a third side surface 85 formed by a third circular arc 84 having a third curvature radius $R_3$ in a plan view. In comparison with this third side surface 85, the second side edge portion 79 may have a fourth side surface 87 formed by a fourth circular arc 86 having a fourth curvature radius $R_4$ smaller than the third curvature radius $R_3$ in a plan view. If the second side edge portion 79 includes the sine curve 47, a curved surface of each of the second curved convex portion 81 and the second curved concave portion 82 may be formed by the fourth circular arc 86.

In the preferred embodiment, the second side edge portion 79 including the sine curve 80 is formed as a pair of second side edge portions along the third direction $X_2$. In other words, both side edges of the third linear portion 72 may be the second side edge portion 79 including the sine curve 80. The pair of sine curves 80 may include one sine curve 80A and the other sine curve 80B. When compared, the sine curve 80A and the other sine curve 80B may be different from each other in the formation position of the second curved convex portion 81 in the third direction $X_2$. For example, the second curved convex portion 81 of the sine curve 80A may deviate from the second curved convex portion 81 of the other sine curve 80B in the fourth direction $Y_2$.

In the preferred embodiment, the second curved convex portion 81 of the sine curve 80A faces the second curved concave portion 82 of the other sine curve 80B in the fourth direction $Y_2$. Additionally, the second curved convex portion 81 of the other sine curve 80B faces the second curved concave portion 82 of the sine curve 80A. Thereby, the second curved convex portion 81 (second curved concave portion 82) is formed alternately between the second side portion 75 including the sine curve 80A and the second side portion 75 including the other sine curve 80B in the third direction $X_2$.

As thus described, the third linear portion 72 has the second side portion 75 including both the second curved convex portion 81 and the second curved concave portion 82 as shown in FIG. 5. On the other hand, there is a case in which the second curved convex portion 81 of the sine curve 80 and a curved portion of the second curved concave portion 82 will be seen as being pointed, for example, if the magnification is low when the third linear portion 72 is observed. In this case, the second side portion 75 may be defined as being formed in a zigzag shape in a plan view. The shape of the top portion of the second convex portion 77 that protrudes to the outside of the zigzag shape may correspond to the shape of the curved surface of the second curved convex portion 81.

Additionally, the second convex portion 77 and the second concave portion 78 mentioned above may be selectively formed at the second covering layer 61 that is one of the second base layer 60 and the second covering layer 61 both of which are constituents of the second electroconductive member 59. Of course, the second convex portion 77 and the second concave portion 78 may be formed at both the second base layer 60 and the second covering layer 61.

Figure 7:
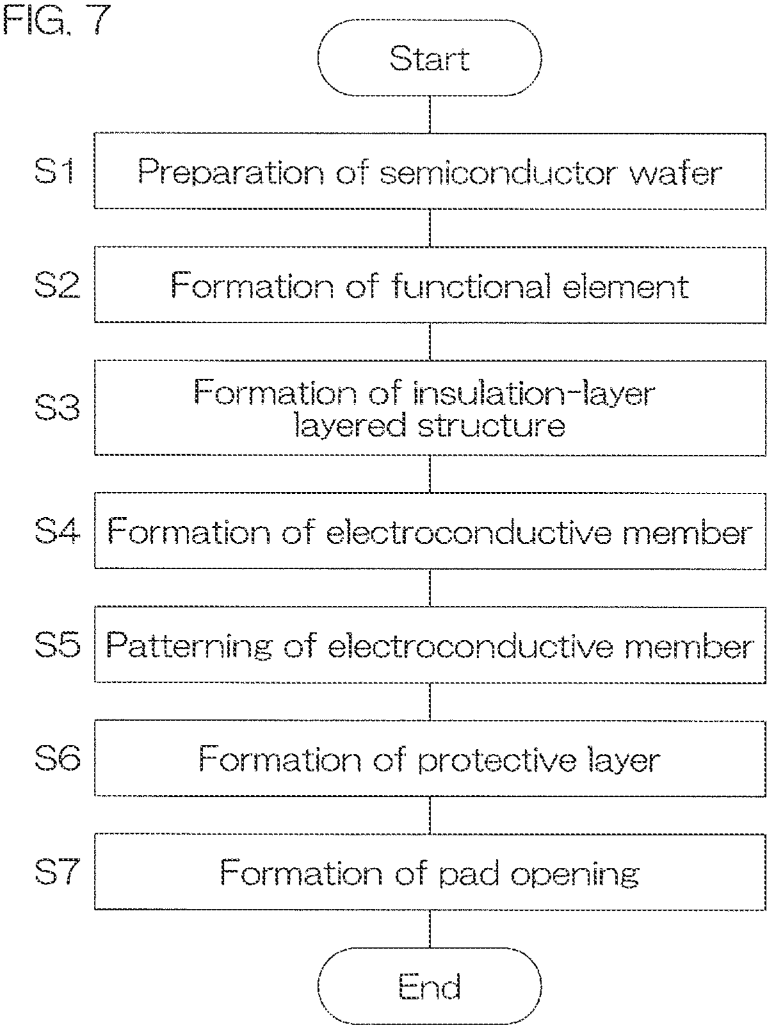
FIG. 7 is a flowchart that shows a part of a manufacturing process of the semiconductor chip of FIG. 1 in order of process steps.

FIG. 7 is a flowchart showing a part of a manufacturing process of the semiconductor chip 4 in order of process steps.

For example, a semiconductor wafer is prepared to manufacture the semiconductor chip 4 (Step S1). The semiconductor wafer serves as a base of the semiconductor substrate 15. Thereafter, the functional element 16 is formed at the principal surface of the semiconductor wafer (Step S2). The functional element 16 may be formed by performing a known method, such as the implantation of impurities into the semiconductor substrate 15 or the deposition of resistant electroconductive materials. Thereafter, the insulation-layer layered structure 17 is formed on the semiconductor substrate 15 (Step S3). The insulation-layer layered structure 17 may be formed by use of, for example, a technique of forming a known multilayer wiring structure.

Thereafter, the first electroconductive member 25 is formed on the insulation-layer layered structure 17 (Step S4). The first electroconductive member 25 is formed, for example, by subjecting the material of the first base layer 26 and the material of the first covering layer 27 to plating growth on the insulation-layer layered structure 17. Thereafter, the first electroconductive member 25 is subjected to patterning (Step S5). Thereby, the first side portion 41 including both the first convex portion 44 and the first concave portion 45 is formed at the first linear portion 36 of the first electroconductive member 25. In detail, a mask having the pattern of the first side edge portion 46 (sine curve 47) is disposed on a layered structure consisting of the first base layer 26 and the first covering layer 27, and the first covering layer 27 and the first base layer 26 are selectively etched through this mask, and, as a result, the first convex portion 44 and the first concave portion 45 are formed. If the semiconductor chip 4 includes the second electroconductive member 59, the first electroconductive member 25 is first subjected to patterning, and then it is recommended to form the second electroconductive member 59 by repeatedly performing Step S4 and Step S5.

Thereafter, the protective layer 55 is formed on the insulation-layer layered structure 17 so as to cover the first electroconductive member 25 (Step S6). For example, the protective layer 55 may be formed by setting a semiconductor wafer in a mold and then filling this mold with a resin material. Thereafter, heat treatment is performed, and, consequently, the protective layer 55 is hardened (cured).

Thereafter, the pad opening 56 is formed in the protective layer 55, and, as a result, a part of the first electroconductive member 25 is exposed as the pad 14. Thereafter, the semiconductor wafer is cut, and a plurality of semiconductor chips 4 are cut out. The above-described semiconductor chip 4 is obtained through a process including these steps.

Figure 8:
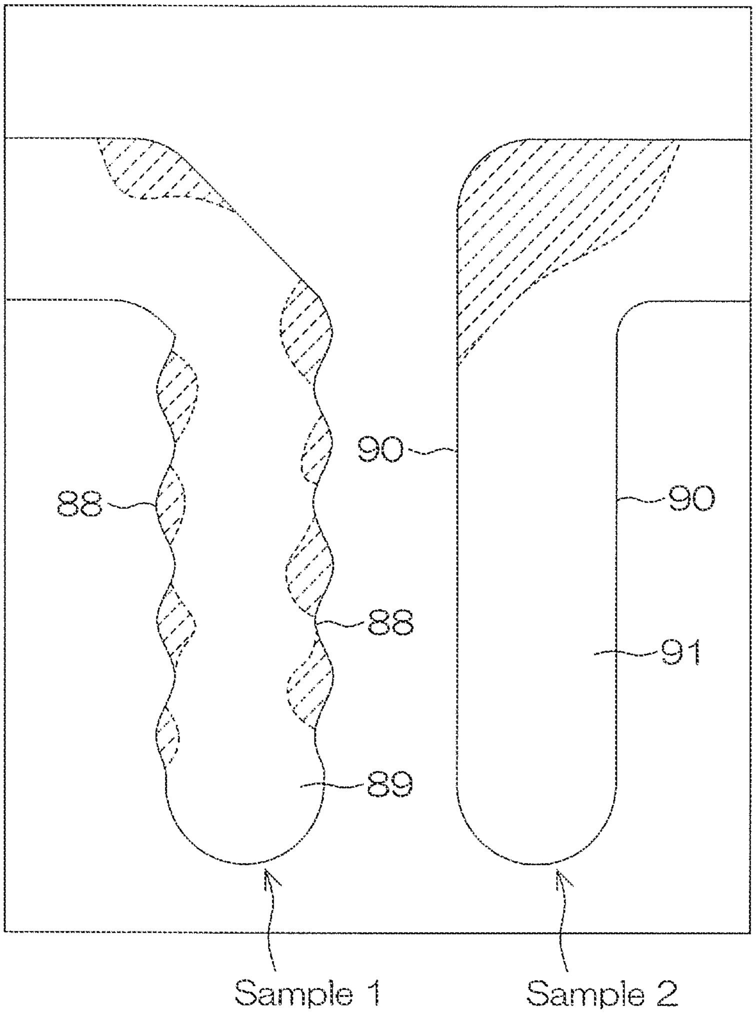
FIG. 8 is a view for describing a stress relaxation effect brought about by the semiconductor device.

FIG. 8 is a view for describing a stress relaxation effect brought about by introducing an uneven structure. In more detail, FIG. 8 shows a result obtained by performing a stress simulation applied to sample 1 and sample 2. Sample 1 is a wiring line 89 in which the side edge portion 88 has been formed by the sine curve 47 mentioned above. Sample 2 is a wiring line 91 in which a side edge portion 90 has been formed linearly. In FIG. 8, a region to which broken-line hatching is given is a region in which the stress reaches 0.1% to 10% when the stress of an outlined region excluding the hatched region is defined as 100%. Referring to FIG. 8, it has been understood that, in sample 1 in which the uneven structure is employed, the stress applied to the side portion of the wiring line 89 is dispersed, and is made smaller as a whole than sample 2 in which the uneven structure is not employed.

Additionally, a heat cycle test was performed concerning sample 1. Test conditions are −65° C. to 150° C., and cycle number: 500 cycles (30 minutes at high temperature and 30 minutes at low temperature). After performing the test, a cross-section SEM image of sample 1 was observed, and, as a result, the occurrence of cracks beginning at the edge portion 88 of the wiring line 89 was not discovered in the protective layer 55 made of an organic insulating resin. From this result, it is considered that, in sample 1, the stress applied to the side portion of the wiring line 89 was dispersed by the uneven structure of the side edge portion 88 of the wiring line 89.

The first side edge portion 46 is formed by the sine curve 47 in the semiconductor chip 4 according to the preferred embodiment, and therefore it is possible to disperse the stress generated in the first side portion 41 of the first linear portion 36 as shown in the simulation result of FIG. 8. This makes it possible to reduce the stress of the first side portion 41 of the first linear portion 36 of the first electroconductive member 25 as a whole. As a result, it is possible to restrain a distortion that occurs in the protective layer 55 when expansion and shrinkage are caused by a change in ambient temperature (for example, a change in temperature when the protective layer 55 is cured).

Additionally, the stress dispersion structure is formed by selectively forming the first convex portion 44 and the first concave portion 45 at the first side portion 41 of the first linear portion 36, not by the fact that the first electroconductive member 25 meanders as a whole so as to assume the shape of the letter S. Therefore, there is no need to widen an installation space for the first electroconductive member 25, and therefore it is possible to prevent the semiconductor chip 4 from being enlarged.

Additionally, it is possible to disperse stress generated in the second side portion 75 of the third linear portion 72 if the semiconductor chip 4 includes the second electroconductive member 59 and if the second side edge portion 79 of this second electroconductive member 59 is also formed by the sine curve 80. This makes it possible to reduce the stress of the second side portion 75 of the third linear portion 72 of the second electroconductive member 59 as a whole. As a result, it is possible to restrain a distortion that occurs in the protective layer 55 when expansion and shrinkage are caused by a change in temperature.

The preferred embodiment of the present disclosure has been described as above, and yet the present disclosure can be implemented in other modes.

For example, the wiring layer of the LSI chip has been taken as an example of the first and second electroconductive members 25 and 59 in the above-described preferred embodiment, and yet the characteristic structure of the first and second electroconductive members 25 and 59 can also be employed for the structure of, for example, wirings, electrodes, and coils of other semiconductor elements. In more detail, it is also possible to employ the characteristic structure for a front surface wiring of a wafer level CSP (Wafer level Chip Size Package), a coil joint portion of an isolation transformer element, or the like.

The preferred embodiments of the present disclosure so far described are examples in every respect and should not be understood in a limited manner and are intended to include changes in every respect.

Features mentioned below are extractable from this description and from the drawings. In the following features, each numeric character or the like in parentheses represents a reference sign of a corresponding component mentioned in the detailed description. However, each component mentioned below is not intended to be limited by the reference sign as an equivalent of each component mentioned above.

APPENDIX 1-1

A semiconductor device (1) including:

a semiconductor chip (4, 15);

a first conductive layer (25) that is formed on the semiconductor chip (4, 15) and that has a first linear portion (36) extending along a principal surface (11) of the semiconductor chip (4, 15); and an organic insulation layer (55) that is formed on the semiconductor chip (4, 15) and that covers the first conductive layer (25), wherein the first linear portion (36) includes a base portion (40) having a joining region to which a joining member is connectable and a first side portion (41) including a convex portion (44, 48) that protrudes from the base portion (40) in a direction intersecting a longitudinal direction of the first linear portion (36) and a concave portion (45, 49) that is hollowed with respect to the convex portion (44, 48).

There is a case in which a high stress will be generated in the first side portion of the first linear portion because of a difference in the thermal expansion coefficient between the first electroconductive member and the organic insulation layer when ambient temperature changes, for example, if the first side portion of the first linear portion is a straight line. If an external force is applied to the organic insulation layer by this stress when expansion and shrinkage are caused by a change in temperature, a distortion will occur in the organic insulation layer, and the mechanical characteristics of the organic insulation layer might decrease. Therefore, if the semiconductor device according to the preferred embodiment is employed, it is possible to disperse the stress generated in the first side portion of the first linear portion because the first side portion of the first linear portion includes the convex portion and the concave portion. This makes it possible to reduce the stress of the first side portion of the first linear portion of the first electroconductive member as a whole. As a result, it is possible to restrain a distortion that occurs in the organic insulation layer when expansion and shrinkage are caused by a change in temperature.

APPENDIX 1-2

The semiconductor device (1) according to Appendix 1-1, wherein the convex portion (44, 48) and the concave portion (45, 49) include a plurality of curved convex portions (48) and a plurality of curved concave portions (49) alternately formed by a sine curve (47) extending along the longitudinal direction of the first linear portion (36).

With this configuration, the convex portion and the concave portion are curved convex portions and curved concave portions, respectively, and therefore it is possible to prevent a stress from concentrating on specific places of the convex and concave portions.

APPENDIX 1-3

The semiconductor device (1) according to Appendix 1-2, wherein the first side portion (41) of the first linear portion (36) is formed by a pair of sine curves (47A, 47B) extending along the longitudinal direction of the first linear portion (36).

With this configuration, it is possible to disperse a stress in each of the pair of first side portions of the first linear portion.

APPENDIX 1-4

The semiconductor device (1) according to Appendix 1-3, wherein the curved convex portion (48) of the sine curve (47A) that is one of the pair of sine curves faces the curved concave portion (49) of the sine curve (47B) that is other one of the pair of sine curves, and the curved convex portion (48) of the sine curve (47B) that is other one of the pair of sine curves faces the curved concave portion (49) of the sine curve (47A) that is one of the pair of sine curves in a direction intersecting the longitudinal direction of the first linear portion (36).

With this configuration, the curved convex portion (curved concave portion) is alternately formed at the first side portion on one side and at the first side portion on the other side along the longitudinal direction of the first linear portion. For example, a case is considered in which a stress in at least one (for example, curved convex portion) of the curved convex and concave portions is made smaller than a stress in other one (for example, curved concave portion) of the curved convex and concave portions. In this case, a stress relaxation part of the first linear portion does not appear intermittently along the longitudinal direction of the first linear portion, but appears alternately and continuously at the first side portion on one side and at the first side portion on the other side. Therefore, it is possible to reduce the biased stress relaxation part of the first linear portion.

APPENDIX 1-5

The semiconductor device (1) according to any one of Appendix 1-2 to Appendix 1-4, wherein the base portion (40) is formed in a belt shape having a first width ($W_2$), and the first width ($W_2$) of the base portion (40) is five or more times as long as an amplitude ($A_1$) of the sine curve (47).

With this configuration, it is possible to achieve a stress dispersion effect in the first electroconductive member, for example, by forming a curved convex portion and a curved concave portion by use of a sine curve having an amplitude corresponding to about ⅕ of the width of an already-existing first electroconductive layer (for example, wiring line or electrode). Conversely speaking, it is possible to comparatively widely maintain the first width of the base portion even if the stress dispersion structure is formed by both the curved convex portion and the curved concave portion. As a result, it is possible to leave many choices (e.g., shape, thickness, etc., of the joining member) for the joining member that is joinable to the base portion.

APPENDIX 1-6

The semiconductor device (1) according to any one of Appendix 1-2 to Appendix 1-5, wherein the first conductive layer (25) includes a forward end portion (39) including a part of the first linear portion (36) and a second linear portion (37) connected to the first linear portion (36) through a corner portion (38), and the sine curve (47) is selectively formed at the first linear portion (36) that is one of the first linear portion (36) and the second linear portion (37).

With this configuration, the curved convex portion and the curved concave portion are formed by the sine curve at the first linear portion including the forward end portion in which a stress is easily caused by a change in ambient temperature, and therefore it is possible to effectively disperse the stress in the first electroconductive member.

APPENDIX 1-7

The semiconductor device (1) according to Appendix 1-6, wherein the forward end portion (39) of the first conductive layer (25) has a first side surface (52) formed by a first circular arc (51) having a first curvature radius ($R_1$) in a plan view, and at least one of the curved convex portion (48) and the curved concave portion (49) of the sine curve (47) has a second side surface (54) formed by a second circular arc (53) having a second curvature radius ($R_2$) smaller than the first curvature radius ($R_1$) in a plan view.

APPENDIX 1-8

The semiconductor device (1) according to any one of Appendix 1-1 to Appendix 1-7, wherein the first conductive layer (25) includes a first base layer (26) and a first covering layer (27) stacked on the first base layer (26) so as to protrude sidewardly from an end surface (29) of the first base layer (26) in a cross-sectional view, and the first side portion (41) including the convex portion (44, 48) and the concave portion (45, 49) is selectively formed at the first covering layer (27).

With this configuration, the first side portion including the convex portion and the concave portion is selectively formed at the first covering layer, and is not required to be formed at the first base layer. Therefore, it is possible to reduce the number of steps of a process of forming the convex portion and the concave portion.

APPENDIX 1-9

The semiconductor device (1) according to any one of Appendix 1-1 to Appendix 1-8, wherein the organic insulation layer (55) has a pad opening (56) that exposes the base portion (40) of the first linear portion (36) as a pad (14).

With this configuration, it is possible to connect a joining member, such as a bonding wire, to the base portion of the first linear portion through the pad opening.

APPENDIX 1-10

The semiconductor device (1) according to any one of Appendix 1-1 to Appendix 1-8, further including a second conductive layer (59) connected to the base portion (40) of the first linear portion (36) in the organic insulation layer (55).

With this configuration, the stress dispersion structure mentioned above prevents mechanical characteristics of the organic insulation layer around the second electroconductive member from being lowered. Therefore, it is possible to improve connection reliability between the first electroconductive member (first linear portion) and the second electroconductive member.

APPENDIX 1-11

The semiconductor device (1) according to Appendix 1-10, wherein the second conductive layer (59) has a third linear portion (72) extending along the principal surface (11) of the semiconductor chip (4, 15), and the third linear portion (72) includes a second side portion (75) including a second convex portion (77, 81) that protrudes in a direction intersecting a longitudinal direction of the third linear portion (72) and a second concave portion (78, 82) that is hollowed with respect to the second convex portion (77, 81) in a plan view.

With this configuration, it is possible to disperse the stress generated in the second side portion of the third linear portion because the second side portion of the third linear portion includes the second convex portion and the second concave portion. This makes it possible to reduce the stress of the second side portion of the third linear portion of the second conductive layer as a whole. As a result, it is possible to restrain a distortion that occurs in the organic insulation layer when expansion and shrinkage are caused by a change in temperature.

APPENDIX 1-12

The semiconductor device (1) according to Appendix 1-11, wherein the second conductive layer (59) includes a second base layer (60) and a second covering layer (61) stacked on the second base layer (60) so as to protrude sidewardly from an end surface (63) of the second base layer (60) in a cross-sectional view, and the second side portion (75) including the second convex portion (77, 81) and the second concave portion (78, 82) is selectively formed at the second covering layer (61).

With this configuration, the second side portion including the second convex portion and the second concave portion is selectively formed at the second covering layer, and is not required to be formed at the second base layer. Therefore, it is possible to reduce the number of steps of a process of forming the second convex portion and the second concave portion.

APPENDIX 1-13

The semiconductor device (1) according to any one of Appendix 1-1 to Appendix 1-12, including an insulation-layer layered structure (17) that is formed between the first conductive layer (25) and the semiconductor chip (4, 15) and that includes at least a first inorganic insulation layer (18, 57) and a second inorganic insulation layer (19, 58) stacked on the first inorganic insulation layer (18, 57).

APPENDIX 1-14

The semiconductor device (1) according to any one of Appendix 1-1 to Appendix 1-13, including an integrated circuit element (16) that is formed at the semiconductor chip (4, 15) and that is electrically connected to the first conductive layer (25).

With this configuration, it is possible to reduce the stress of the first side portion of the first linear portion of the first electroconductive member as described above, and therefore it is possible to provide a semiconductor device including an integrated circuit in which the insulation reliability of an organic insulation layer is high.

APPENDIX 2-1

A semiconductor device (1) including:

a semiconductor chip (4, 15);

a first wiring layer (25) that is formed on the semiconductor chip (4, 15) and that extends along a principal surface (11) of the semiconductor chip (4, 15); and an organic insulation layer (55) that is formed on the semiconductor chip (4, 15) and that covers the first wiring layer (25), wherein the first wiring layer (25) has a first side portion (41) including a zigzag shape (47) formed along an extending direction of the first wiring layer (25) in a plan view.

There is a case in which a high stress will be generated in the first side portion of the first wiring layer because of a difference in the thermal expansion coefficient between the first wiring layer and the organic insulation layer when ambient temperature changes, for example, if the first side portion of the first wiring layer is a straight line. If an external force is applied to the organic insulation layer by this stress when expansion and shrinkage are caused by a change in temperature, a distortion will occur in the organic insulation layer, and the mechanical characteristics of the organic insulation layer might decrease. Therefore, if the semiconductor device according to the preferred embodiment is employed, it is possible to disperse the stress generated in the first side portion of the first wiring layer because the first side portion of the first wiring layer includes the zigzag shape. This makes it possible to reduce the stress of the first side portion of the first wiring layer as a whole. As a result, it is possible to restrain a distortion that occurs in the organic insulation layer when expansion and shrinkage are caused by a change in temperature.

APPENDIX 2-2

The semiconductor device (1) according to Appendix 2-1, wherein a top portion of (47) having the zigzag shape is formed by a first circular arc (53) that has a first curvature radius ($R_2$) in a plan view.

With this configuration, the top portion having the zigzag shape is curved, and therefore it is possible to prevent a stress from concentrating on the top portion.

APPENDIX 2-3

The semiconductor device (1) according to Appendix 2-2, wherein the first side portion (41) of the first wiring layer (25) is formed by a pair of zigzag shapes (47A, 47B) extending along the extending direction of the first wiring layer (25).

With this configuration, it is possible to disperse the stress in each of the pair of first side portions of the first wiring layer.

APPENDIX 2-4

The semiconductor device (1) according to Appendix 2-3, wherein a convex portion (44, 48) of the zigzag shape (47A) that is one of the pair of zigzag shapes faces a concave portion (45, 49) of the zigzag shape (47B) that is other one of the pair of zigzag shapes, and a convex portion (44, 48) of the zigzag shape (47B) that is other one of the pair of zigzag shapes faces a concave portion (45, 49) of the zigzag shape (47A) that is one of the pair of zigzag shapes in a direction intersecting the extending direction of the first wiring layer (25).

With this configuration, the convex portion (concave portion) is alternately formed at the first side portion on one side and at the first side portion on the other side along the longitudinal direction of the first wiring layer. For example, a case is considered in which a stress in at least one (for example, convex portion) of the convex and concave portions is made smaller than a stress in other one (for example, concave portion) of the convex and concave portions. In this case, a stress relaxation part of the first wiring layer does not appear intermittently along the longitudinal direction of the first wiring layer, but appears alternately and continuously at the first side portion on one side and at the first side portion on the other side. Therefore, it is possible to reduce the biased stress relaxation part of the first wiring layer.

APPENDIX 2-5

The semiconductor device (1) according to any one of Appendix 2-2 to Appendix 2-4, wherein the first wiring layer (25) includes a first linear portion (36) including a forward end portion (39) and a second linear portion (37) connected to the first linear portion (36) through a corner portion (38), and the zigzag shape (47) is selectively formed at the first linear portion (36) that is one of the first linear portion (36) and the second linear portion (37).

With this configuration, the zigzag shape is formed at the first linear portion including the forward end portion in which a stress is easily caused by a change in ambient temperature, and therefore it is possible to effectively disperse the stress in the first wiring layer.

APPENDIX 2-6

The semiconductor device (1) according to Appendix 2-5, wherein the forward end portion of the first wiring layer (25) is formed by a second circular arc (51) having a second curvature radius ($R_1$) larger than the first curvature radius ($R_2$) in a plan view.

APPENDIX 2-7

The semiconductor device (1) according to any one of Appendix 2-1 to Appendix 2-6, wherein the first wiring layer (25) includes a first base layer (26) and a first covering layer (27) stacked on the first base layer (26) so as to protrude sidewardly from an end surface (29) of the first base layer (26) in a cross-sectional view, and the first side portion (41) including the zigzag shape (47) is selectively formed at the first covering layer (27).

With this configuration, the first side portion including the zigzag shape is selectively formed at the first covering layer, and is not required to be formed at the first base layer. Therefore, it is possible to reduce the number of steps of a process of forming the zigzag shape.

APPENDIX 2-8

The semiconductor device (1) according to any one of Appendix 2-1 to Appendix 2-7, wherein the organic insulation layer (55) has a pad opening (56) that exposes the first wiring layer (25) as a pad (14).

With this configuration, it is possible to connect a joining member, such as a bonding wire, to the first wiring layer through the pad opening.

APPENDIX 2-9

The semiconductor device (1) according to any one of Appendix 2-1 to Appendix 2-7, further including a second wiring layer (59) connected to the first wiring layer (25) in the organic insulation layer (55).

With this configuration, the stress dispersion structure mentioned above prevents mechanical characteristics of the organic insulation layer around the second wiring layer from being lowered. Therefore, it is possible to improve connection reliability between the first wiring layer and the second wiring layer.

APPENDIX 2-10

The semiconductor device (1) according to Appendix 2-9, wherein the second wiring layer (59) has a second side portion (75) including a second zigzag shape (80) formed along an extending direction of the second wiring layer (59) in a plan view.

With this configuration, it is possible to disperse the stress generated in the second side portion of the second wiring layer because the second side portion of the second wiring layer includes the second zigzag shape. This makes it possible to reduce the stress of the second side portion of the second wiring layer as a whole. As a result, it is possible to restrain a distortion that occurs in the organic insulation layer when expansion and shrinkage are caused by a change in temperature.

APPENDIX 2-11

The semiconductor device (1) according to Appendix 2-10, wherein the second wiring layer (59) includes a second base layer (60) and a second covering layer (61) stacked on the second base layer (60) so as to protrude sidewardly from an end surface (63) of the second base layer (60) in a cross-sectional view, and the second side portion (75) including the second zigzag shape (80) is selectively formed at the second covering layer (61).

With this configuration, the second side portion including the second zigzag shape is selectively formed at the second covering layer, and is not required to be formed at the second base layer. Therefore, it is possible to reduce the number of steps of a process of forming the second zigzag shape.

APPENDIX 2-12

The semiconductor device (1) according to any one of Appendix 2-1 to Appendix 2-11, including an insulation-layer layered structure (17) that is formed between the first wiring layer (25) and the semiconductor chip (4, 15) and that includes at least a first inorganic insulation layer (18, 57) and a second inorganic insulation layer (19, 58) stacked on the first inorganic insulation layer (18, 57).

APPENDIX 2-13

The semiconductor device (1) according to any one of Appendix 2-1 to Appendix 2-12, including an integrated circuit element (16) that is formed at the semiconductor chip (4, 15) and that is electrically connected to the first wiring layer (25).

With this configuration, it is possible to reduce the stress of the first side portion of the first wiring layer as described above, and therefore it is possible to provide a semiconductor device including an integrated circuit in which the insulation reliability of an organic insulation layer is high.

APPENDIX 3-1

A semiconductor device (1) including:

a semiconductor substrate (4, 15);

a first electroconductive member (25) that is formed on the semiconductor substrate (4, 15), that has a first linear portion (36) extending along a principal surface (11) of the semiconductor substrate (4, 15), and that has a first thermal expansion coefficient; and a resin layer (55) that is formed on the semiconductor substrate (4, 15), that covers the first electroconductive member (25), and that has a second thermal expansion coefficient higher than the first thermal expansion coefficient, wherein the first linear portion (36) includes a first side edge portion (46) formed by a curve (47) that is alternately bent to one side and to one other side in a direction intersecting a longitudinal direction of the first linear portion (36) in a plan view.

There is a case in which a high stress will be generated in the first side portion of the first linear portion because of a difference in the thermal expansion coefficient, which is caused by the fact that the resin layer expands more than the first electroconductive member when ambient temperature changes, for example, if the first side edge portion of the first linear portion is a straight line. If an external force is applied to the resin layer by this stress when expansion and shrinkage are caused by a change in temperature, a distortion will occur in the resin layer, and the mechanical characteristics of the resin layer might decrease. Therefore, if the semiconductor device according to the preferred embodiment is employed, it is possible to disperse the stress generated in the first side portion of the first linear portion because the first side edge portion is formed by the curve. This makes it possible to reduce the stress of the first side portion of the first linear portion of the first electroconductive member as a whole. As a result, it is possible to restrain a distortion that occurs in the resin layer when expansion and shrinkage are caused by a change in temperature.

APPENDIX 3-2

The semiconductor device (1) according to Appendix 3-1, wherein the first linear portion (36) includes a base portion (40) to which a joining member is connectable and a first side portion (41) including a convex portion (44, 48) that protrudes from the base portion (40) in a direction intersecting the longitudinal direction of the first linear portion (36) and a concave portion (45, 49) that is hollowed with respect to the convex portion (44, 48), and the first side edge portion (46) is formed by a curve (47) that continuously connects the convex portion (44, 48) and the concave portion (45, 49) along the longitudinal direction of the first linear portion (36) in a plan view.

With this configuration, the stress generated in the first side portion including the convex portion and the concave portion is dispersed, and therefore it is possible to restrain a decrease in the mechanical characteristics of the resin layer even if a stress is further applied to the first linear portion when a joining member is connected to the base portion of the first linear portion. Additionally, a stress dispersion structure is formed by selectively forming the convex portion and the concave portion at the first side portion of the first linear portion, not by the fact that the first electroconductive member meanders as a whole so as to assume the shape of the letter S. Therefore, there is no need to widen an installation space for the first electroconductive member according to the preferred embodiment, and therefore it is possible to prevent the semiconductor device from being enlarged.

APPENDIX 3-3

The semiconductor device (1) according to Appendix 3-2, wherein the base portion (40) is formed in a belt shape having a first width ($W_2$), and the first width ($W_2$) of the base portion (40) is ten or more times as long as the amount of protrusion ($P_1$) of the convex portion (44, 48) from the base portion (40).

With this configuration, it is possible to achieve a stress dispersion effect in the first electroconductive member, for example, by forming a convex portion having an amount of protrusion corresponding to about 1/10 of the width of an already-existing first electroconductive member (for example, wiring line or electrode). Conversely speaking, it is possible to comparatively widely maintain the first width of the base portion even if the stress dispersion structure is formed by both the convex portion and the concave portion. As a result, it is possible to leave many choices (e.g., shape, thickness, etc., of the joining member) for the joining member that is joinable to the base portion.

APPENDIX 3-4

The semiconductor device (1) according to any one of Appendix 3-1 to Appendix 3-3, wherein the first electroconductive member (25) includes a forward end portion (39) including a part of the first linear portion (36) and a second linear portion (37) connected to the first linear portion (36) through a corner portion (38), and the first side edge portion (46) is selectively formed at the first linear portion (36) that is one of the first linear portion (36) and the second linear portion (37).

With this configuration, the first side edge portion having a curved shape is formed at the first linear portion including the forward end portion in which a stress is easily caused by a change in ambient temperature, and therefore it is possible to effectively disperse the stress in the first electroconductive member.

APPENDIX 3-5

The semiconductor device (1) according to Appendix 3-4, wherein the forward end portion (39) of the first electroconductive member (25) has a first side surface (52) formed by a first circular arc (51) having a first curvature radius ($R_1$) in a plan view, and the first side edge portion (46) of the first electroconductive member (25) has a second side surface (54) formed by a second circular arc (53) having a second curvature radius ($R_2$) smaller than the first curvature radius ($R_1$) in a plan view.

APPENDIX 3-6

The semiconductor device (1) according to any one of Appendix 3-1 to Appendix 3-5, wherein the first electroconductive member (25) includes a first base layer (26) and a first covering layer (27) stacked on the first base layer (26) so as to protrude sidewardly from an end surface (29) of the first base layer (26) in a cross-sectional view, and the first side edge portion (46) is selectively formed at the first covering layer (27).

With this configuration, the first side edge portion having a curved shape is selectively formed at the first covering layer, and is not required to be formed at the first base layer. Therefore, it is possible to reduce the number of steps of a process of forming the first side edge portion.

APPENDIX 3-7

The semiconductor device (1) according to Appendix 3-2, wherein the resin layer (55) has a pad opening (56) that exposes the base portion (40) of the first linear portion (36) as a pad (14).

With this configuration, it is possible to connect a joining member, such as a bonding wire, to the base portion of the first linear portion through the pad opening.

APPENDIX 3-8

The semiconductor device (1) according to Appendix 3-2, further including a second electroconductive member (59) connected to the base portion (40) of the first linear portion (36) in the resin layer (55).

With this configuration, the stress dispersion structure mentioned above prevents mechanical characteristics of the resin layer around the second electroconductive member from being lowered. Therefore, it is possible to improve connection reliability between the first electroconductive member (first linear portion) and the second electroconductive member.

APPENDIX 3-9

The semiconductor device (1) according to Appendix 3-8, wherein the second electroconductive member (59) has a third linear portion (72) extending along the principal surface (11) of the semiconductor substrate (4, 15), and the third linear portion (72) includes a second side edge portion (79) formed by a curve (80) that is alternately bent to one side and to one other side in a direction intersecting a longitudinal direction of the third linear portion (72) in a plan view.

With this configuration, it is possible to disperse the stress generated in the second side portion of the third linear portion because the second side edge portion is formed by a curve. This makes it possible to reduce the stress of the second side portion of the third linear portion of the second electroconductive member as a whole. As a result, it is possible to restrain a distortion that occurs in the resin layer when expansion and shrinkage are caused by a change in temperature.

APPENDIX 3-10

The semiconductor device (1) according to Appendix 3-8 or Appendix 3-9, wherein the second electroconductive member (59) includes a second base layer (60) and a second covering layer (61) stacked on the second base layer (60) so as to protrude sidewardly from an end surface (63) of the second base layer (60) in a cross-sectional view, and the second side edge portion (79) is selectively formed at the second covering layer (61).

With this configuration, the second side edge portion having a curved shape is selectively formed at the second covering layer, and is not required to be formed at the second base layer. Therefore, it is possible to reduce the number of steps of a process of forming the second side edge portion.

APPENDIX 3-11

The semiconductor device (1) according to any one of Appendix 3-1 to Appendix 3-10, including an insulation-layer layered structure (17) that is formed between the first electroconductive member (25) and the semiconductor substrate (4, 15) and that includes at least a first inorganic insulation layer (18, 57) and a second inorganic insulation layer (19, 58) stacked on the first inorganic insulation layer (18, 57).

APPENDIX 3-12

The semiconductor device (1) according to any one of Appendix 3-1 to Appendix 3-11, including an integrated circuit element (16) that is formed at the semiconductor substrate (4, 15) and that is electrically connected to the first electroconductive member (25).

With this configuration, it is possible to reduce the stress of the first side portion of the first linear portion of the first electroconductive member as described above, and therefore it is possible to provide a semiconductor device including an integrated circuit in which the insulation reliability of a resin layer is high.

The invention claimed is:

1. A semiconductor device comprising:

a semiconductor substrate;

a first electroconductive member that is formed on the semiconductor substrate and that has a first linear portion extending along a principal surface of the semiconductor substrate; and an organic insulation layer that is formed on the semiconductor substrate and that covers the first electroconductive member, wherein the first linear portion includes a first side edge portion formed by a curve that is alternately bent to one side and to an opposite side in a direction intersecting a longitudinal direction of the first linear portion in a plan view, the first electroconductive member includes a first base layer and a first covering layer stacked on the first base layer so as to protrude sidewardly from an end surface of the first base layer in a cross-sectional view, and the first side edge portion is selectively formed at the first covering layer.

2. The semiconductor device according to claim 1, wherein the first linear portion includes a base portion to which a joining member is connectable and a first side portion including a convex portion that protrudes from the base portion in the direction intersecting a longitudinal direction of the first linear portion and a concave portion that is hollowed with respect to the convex portion, and the first side edge portion is formed by a curve that continuously connects the convex portion and the concave portion along the longitudinal direction of the first linear portion in a plan view.

3. The semiconductor device according to claim 2, wherein the base portion is formed in a belt shape having a first width, and the first width of the base portion is ten or more times as long as an amount of protrusion of the convex portion from the base portion.

4. The semiconductor device according to claim 1, wherein the first electroconductive member further includes a forward end portion including a part of the first linear portion and a second linear portion connected to the first linear portion through a corner portion, and the first side edge portion is further selectively formed at the first linear portion that is one of the first linear portion and the second linear portion.

5. The semiconductor device according to claim 4, wherein the forward end portion of the first electroconductive member has a first side surface formed by a first circular arc having a first curvature radius in a plan view, and the first side edge portion of the first electroconductive member has a second side surface formed by a second circular arc having a second curvature radius smaller than the first curvature radius in a plan view.

6. The semiconductor device according to claim 2, wherein the organic insulation layer has a pad opening that exposes the base portion of the first linear portion as a pad.

7. The semiconductor device according to claim 2, further comprising a second electroconductive member connected to the base portion of the first linear portion in the organic insulation layer.

8. The semiconductor device according to claim 7, wherein the second electroconductive member has a third linear portion that extends along the principal surface of the semiconductor substrate, and the third linear portion includes a second side edge portion formed by a curve that is alternately bent to one side and to an opposite side in a direction intersecting a longitudinal direction of the third linear portion in a plan view.

9. The semiconductor device according to claim 7, wherein the second electroconductive member includes a second base layer and a second covering layer stacked on the second base layer so as to protrude sidewardly from an end surface of the second base layer in the cross-sectional view, and the second side edge portion is selectively formed at the second covering layer.

10. The semiconductor device according to claim 1, comprising an insulation-layer layered structure that is formed between the first electroconductive member and the semiconductor substrate and that includes at least a first inorganic insulation layer and a second inorganic insulation layer stacked on the first inorganic insulation layer.

11. The semiconductor device according to claim 1, comprising an integrated circuit element that is formed at the semiconductor substrate and that is electrically connected to the first electroconductive member.

12. A semiconductor device comprising:

a semiconductor substrate;

a first electroconductive member that is formed on the semiconductor substrate and that has a first linear portion extending along a principal surface of the semiconductor substrate; and an organic insulation layer that is formed on the semiconductor substrate and that covers the first electroconductive member, wherein the first linear portion includes a first side edge portion formed by a curve that is alternately bent to one side and to an opposite side in a direction intersecting a longitudinal direction of the first linear portion in a plan view, the first linear portion includes a base portion to which a joining member is connectable and a first side portion including a convex portion that protrudes from the base portion in the direction intersecting a longitudinal direction of the first linear portion and a concave portion that is hollowed with respect to the convex portion, and the first side edge portion is formed by a curve that continuously connects the convex portion and the concave portion along the longitudinal direction of the first linear portion in a plan view, the base portion is formed in a belt shape having a first width, and the first width of the base portion is ten or more times as long as an amount of protrusion of the convex portion from the base portion.

* * * * *